United States Patent
Teramoto et al.

[11] Patent Number: 5,923,966
[45] Date of Patent: Jul. 13, 1999

[54] LASER PROCESSING METHOD

[75] Inventors: Satoshi Teramoto; Hisashi Ohtani; Akiharu Miyanaga; Toshiji Hamatani, all of Kanagawa; Shunpei Yamazaki, Tokyo, all of Japan

[73] Assignee: Semiconductor Energy Laboratory Co., Ltd., Kanagawa-ken, Japan

[21] Appl. No.: 08/504,991

[22] Filed: Jul. 20, 1995

[30] Foreign Application Priority Data

| Jul. 28, 1994 | [JP] | Japan | 6-198042 |
| Jul. 28, 1994 | [JP] | Japan | 6-198043 |
| Sep. 26, 1994 | [JP] | Japan | 6-256148 |

[51] Int. Cl.$^6$ .............................. H01L 21/00; H01L 21/20
[52] U.S. Cl. ......................... 438/162; 438/166; 438/479; 438/487
[58] Field of Search ................... 148/DIG. 90, DIG. 93, 148/DIG. 92, DIG. 16; 437/173, 174, 907; 117/904

[56] References Cited

U.S. PATENT DOCUMENTS

| 5,147,826 | 9/1992 | Liu et al. | |
| 5,275,851 | 1/1994 | Fonash et al. | |
| 5,294,811 | 3/1994 | Aoyama | 257/59 |
| 5,352,291 | 10/1994 | Zhang | 117/8 |
| 5,492,843 | 2/1996 | Adachi et al. | 437/21 |
| 5,569,610 | 10/1996 | Zhang | 437/21 |
| 5,612,250 | 3/1997 | Ohtani et al. | 437/101 |
| 5,639,698 | 6/1997 | Yamazaki et al. | 437/228 |
| 5,663,077 | 9/1997 | Adachi et al. | 438/151 |

FOREIGN PATENT DOCUMENTS

| 58-93216 | 6/1983 | Japan . |

OTHER PUBLICATIONS

C. Hayzelden et al., "In Situ Transmission Electron Microscopy Studies of Silicide–Mediated Crystallization of Amorphous Silicon" (3 pages).

A.V. Dvurechenskii et al., "Transport Phenomena in Amorphous Silicon Doped by Ion Implantation of 3d Metals", *Akademikian Lavrentev Prospekt* 13, 630090 Novosibirsk 90, USSR, pp. 635–640.

T. Hempel et al., "Needle–Like Crystallization of NI Doped Amorphous Silicon Thin Films", *Solid State Communications*, vol. 85, No. 11, pp. 921–924, 1993.

R. Kakkad et al., "Crystallized Si films by Low–temperature rapid thermal annealing of amorphous silicon," *J. Appl. Phys.*, 65(5), Mar. 1, 1989, pp. 2069–2072.

G. Liu et al., "Polycrystalline silicon thin film transistors on Corning 7059 glass substrates using short time, low–temperature processing," *Appl. Phys. Lett.* 62(20), May 17, 1993, pp. 2554–2556.

G. Liu et al., "Selective area crystallization of amorphous silicon fims by low–temperature rapid thermal annealing," *Appl. Phys. Lett.* 55(7), Aug. 14, 1989, pp. 660–662.

R. Kakkad et al., "Low Temperature Selective Crystallization of Amorphous Silicon," *Journal of Non–Crystalline Solids*, 115, 1989, pp. 66–68.

*Primary Examiner*—John F. Niebling
*Assistant Examiner*—Michael S. Lebentritt
*Attorney, Agent, or Firm*—Sixbey, Friedman, Leedom & Ferguson, P.C.; Eric J. Robinson

[57] ABSTRACT

A laser processing apparatus provides a heating chamber, a chamber for laser light irradiation and a robot arm, wherein a temperature of a substrate on which a silicon film to be irradiated with laser light is formed is heated to 450 to 750° C. in the heating chamber followed by irradiating the silicon film with laser light so that a silicon film having a single crystal or a silicon film that can be regarded as the single crystal can be obtained.

18 Claims, 26 Drawing Sheets

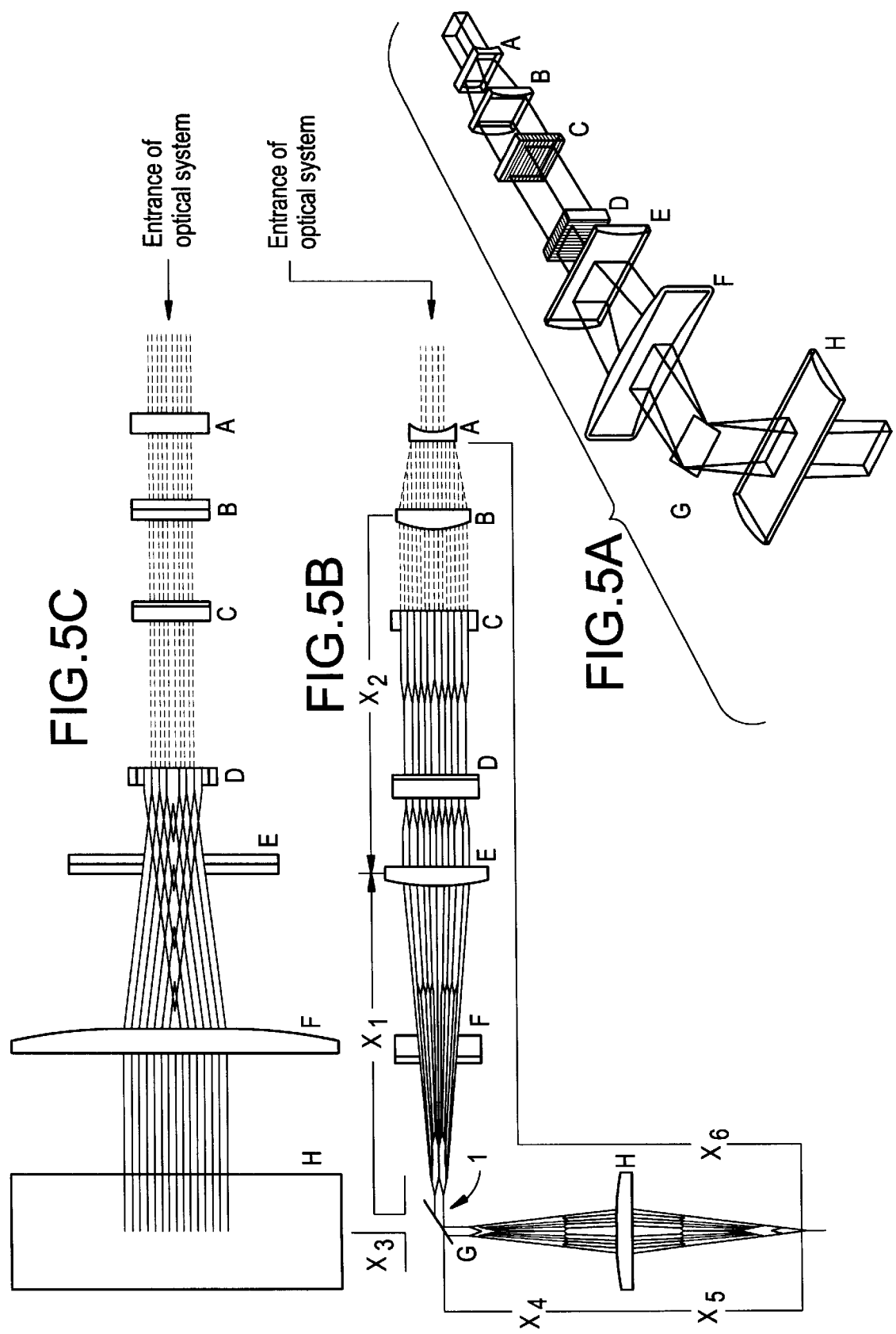

Heat treatment

Laser light irradiation

Impurity ion implantation and laser light irradiation

Laser light irradiation

Impurity ion implantation and laser light irradiation

Heat treatment

Laser light irradiation

Impurity ion implantation and laser light irradiation

FIG.24

| No | Sample manufacture condition | Spin density (spins/cm$^3$) | g Value |
|---|---|---|---|
| 1 | 560°C, 4h | $3.22 \times 10^{18}$ | 2.0055 |
| 2 | 550°C, 4h | $7.72 \times 10^{18}$ | 2.0055 |
| 3 | (550°C, 4h)+LC | $8.21 \times 10^{18}$ | 2.0057 |
| 4 | (550°C, 4h)+LC+(550°C, 4h) | $7.65 \times 10^{17}$ | 2.0051 |
| 5 | 600°C, 24h | $1.06 \times 10^{18}$ | 2.0052 |
| 6 | 600°C, 24h+(Ni) | $3.06 \times 10^{18}$ | 2.0049 |

LASER PROCESSING METHOD

BACKGROUND OF THE INVENTION

1. Field of the Invention

The present invention relates to a technique for subjecting semiconductors to each kind of annealing by irradiating the semiconductors with laser light.

2. Description of the Prior Art

Heretofore, techniques are known for subjecting semiconductors to each kind of annealing by irradiating the semiconductors with laser light. For example, the following techniques are known; a technique for transforming an amorphous silicon film (a-Si film) formed on a glass substrate by the plasma CVD into a crystalline silicon film by irradiating the amorphous silicon film with laser light; and an annealing technique after impurity ion doping, or the like. As each kind of annealing technique using such laser light and an apparatus for laser light irradiation, there is a technique described in Japanese Unexamined Patent Application No. Hei 6-51238 filed by the applicant of the present invention.

Since each kind of annealing treatment using laser light does not cause thermal damage to a base substrate, the treatment becomes a useful technique in the case where a material that is weak to heat such as a glass substrate or the like is used as the substrate. However, there is a problem in that it is difficult to keep the annealing effect on a constant level at all times. Further, when an amorphous silicon film is crystallized by irradiating the amorphous silicon film with laser light, it is difficult to constantly obtain a favorable crystallinity that is required. Thus, a demand has been made on a technique for stably obtaining a crystalline silicon film having a more favorable crystallinity.

SUMMARY OF THE INVENTION

An object of the present invention is to solve at least one or more of the problems described in the following items:

(1) to enable providing a constant effect at all times in techniques of annealing semiconductors by irradiating the semiconductors with laser light; and (2) to further heighten the crystallinity of a crystalline silicon film obtained by irradiating an amorphous silicon film with laser light.

A first embodiment of the invention disclosed herein is a method comprising the steps of: heat-treating an amorphous silicon film to crystallize it; and irradiating the crystallized silicon film with laser light. This method is characterized in that during the irradiation of the laser light, the sample is maintained within ±100° C. of the temperature of the heat-treatment.

In the first embodiment constructed as described above, the temperature of the heat treatment performed during the crystallization step can be selected to be 450–750° C.

The upper limit of this temperature is restricted by the highest tolerable temperature of the substrate. Where a substrate made of glass is used, the upper limit is about 600° C. Where the productivity is taken into account, this temperature is preferably above 550° C. Therefore, where a glass substrate is employed, it is desired to perform a heat treatment at a temperature of about 550–600° C.

During the laser irradiation, the heating temperature is preferably set to about 550–600° C. Heating starting from a temperature of about 450° C. can be put into practical use. Accordingly, the heating temperature preferably lies in the range of 550° C.±100° C.

A second embodiment of the invention disclosed herein is a method comprising the steps of: heat-treating an amorphous silicon film at a temperature lower than 600° C. to crystallize the amorphous silicon film; and irradiating the crystallized silicon film with laser light. This method is characterized in that during the laser irradiation, the sample is maintained within ±100° C. of the temperature of the heat treatment.

A third embodiment of the invention disclosed herein is a method comprising the steps of: heat-treating an amorphous silicon film to crystallize it; implanting impurity ions into at least a region of the crystallized silicon film; and irradiating the ion-implanted region with laser light. This method is characterized in that during the laser irradiation, the sample is maintained within ±100° C. of the temperature of the heat treatment.

A fourth embodiment of the invention disclosed herein is a method comprising the steps of: heat-treating an amorphous silicon film to crystallize it; implanting impurity ions into at least a region of the crystallized silicon film; and irradiating the ion-implanted region with laser light. This method is characterized in that during the laser irradiation, the sample is maintained within ±100° C. of the temperature of the heat treatment.

A fifth embodiment of the invention disclosed herein is a method comprising the steps of: irradiating an amorphous silicon film with a laser beam having a linear cross section while moving the laser beam in steps from one side of the amorphous silicon film to opposite side to crystallize irradiated regions in succession. This method is characterized in that the laser irradiation is performed while heating the irradiated surface above 450° C.

In the fifth embodiment constructed as described above, the laser beam of the linear cross section is moved in steps and made to impinge on the film. Consequently, the required regions can be effectively irradiated with the laser light. Normally, the temperatures of irradiated surfaces are limited to about 600° C. However, these temperature are restricted by the material of the substrate. Higher temperatures may also be used.

A sixth embodiment of the invention disclosed herein is a method comprising the steps of: introducing a metal element for promoting crystallization into an amorphous silicon film; heat-treating the amorphous silicon film to crystallize it; and irradiating the crystallized silicon film with laser light. This method is characterized in that during the laser irradiation, the sample is maintained within ±100° C. of the temperature of the heat treatment.

In the sixth embodiment constructed as described above and in the following seventh through tenth embodiments, the metal element for promoting crystallization is one or more elements selected from the group consisting of Fe, Co, Ni, Ru, Rh, Pd, Os, Ir, Pt, Cu, Zn, Ag, and Au. Among these metal elements, nickel is the element producing the most conspicuous effect.

In the above-described configurations, the heat treatment temperature can be selected to lie within the range of from 450° C. to 750° C. The upper limit of this temperature is restricted by the highest tolerable temperature of the substrate. Where a glass substrate is used, the upper limit is roughly 600° C. Where the productivity is taken into consideration, this temperature is preferably higher than 550° C. Accordingly, where a glass substrate is employed, the heat treatment is preferably performed at a temperature of about 550–600° C.

Furthermore, during the laser irradiation, the heat treatment temperature is preferably about 550–600° C. Heating starting from a temperature of about 450° C. can be put into practical use. In consequence, it is desired to heat the substrate within the temperature range of from 550° C.±100° C.

A seventh embodiment of the invention disclosed herein is a method comprising the steps of: introducing a metal element for promoting crystallization into an amorphous silicon film; heat-treating the amorphous silicon film at a temperature lower than 600° C. to crystallize it; and irradiating the crystallized silicon film with laser light. This method is characterized in that during the laser irradiation, the sample is maintained within±100° C. of the temperature of the heat treatment.

An eighth embodiment of the invention disclosed herein is a method comprising the steps of: introducing a metal element for promoting crystallization into an amorphous silicon film; heat-treating the amorphous silicon film to crystallize it; implanting impurity ions into at least a region of the crystallized silicon film; and irradiating the ion-implanted region with laser light. This method is characterized in that during the laser irradiation, the sample is maintained within±100° C. of the temperature of the heat treatment.

A ninth embodiment of the invention disclosed herein is a method comprising the steps of: introducing a metal element for promoting crystallization into an amorphous silicon film; heat-treating the amorphous silicon film to crystallize it; implanting impurity ions into at least a region of the crystallized silicon film; and irradiating the ion-implanted region with laser light. This method is characterized in that during the laser irradiation, the sample is maintained within ±100° C. of the temperature of the heat treatment.

A tenth embodiment of the invention disclosed herein is a method comprising the steps of: introducing a metal element for promoting crystallization into an amorphous silicon film; irradiating the amorphous silicon film with a laser beam having a linear cross section while moving the laser beam in steps from one side of the amorphous silicon film to opposite side to crystallize irradiated regions in succession. This method is characterized in that the laser irradiation is performed while heating the irradiated surface above 450° C.

In the tenth embodiment constructed as described above, the laser beam of the linear cross section is moved in steps and made to impinge on desired regions. Consequently, the desired regions can be effectively irradiated with the laser light. Normally, the temperatures of irradiated surfaces are limited to about 600° C. However, these temperature are restricted by the material of the substrate. Higher temperatures may also be used.

A laser processing method according to an eleventh embodiment of the invention consists of irradiating a silicon film formed on a glass substrate with laser light. This method is characterized in that during the laser irradiation, the silicon film is heated at a temperature which is higher than 455° C. and lower than strain point of the glass substrate.

A laser processing method according to a twelfth embodiment of the invention comprises the steps of: irradiating a silicon film formed on a glass substrate with laser light; and then heating the silicon film at a temperature which is higher than 500° C. and lower than strain point of the glass substrate. This method is characterized in that during the laser irradiation, the silicon film is heated at a temperature which is higher than 455° C. and lower than the strain point of the glass substrate.

A laser processing method according to a thirteenth embodiment of the invention consists of irradiating a silicon film formed on a glass substrate with laser light. This method is characterized in that during the laser irradiation, the silicon film is heated at a temperature of 550° C.±30° C.

A laser processing method according to a fourteenth embodiment of the invention comprises the steps of: irradiating a silicon film formed on a glass substrate with laser light; and then heating the silicon film at a temperature of 550° C.±30° C. This method is characterized in that during the laser irradiation, the silicon film is heated at a temperature of 550° C.±30° C.

A laser processing method according to a fifteenth embodiment of the invention comprises the steps of: forming a silicon film on a glass substrate; heating the silicon film up to a desired temperature; and irradiating the silicon film with laser light while maintaining the desired temperature. This method is characterized in that the desired temperature is higher than 500° C. and lower than strain point of the glass substrate.

A laser processing method according to a sixteenth embodiment of the invention comprises the steps of: forming a silicon film on a glass substrate; making a first heat treatment of said amorphous silicon film to crystallize it; irradiating the crystallized silicon film with laser light; and then making a second heat treatment of the silicon film. This method is characterized in that one or both of the first and second heat treatments are made at a temperature which is higher than 500° C. and lower than strain point of the glass substrate. This method is also characterized in that the laser irradiation step is performed while heating the substrate at a temperature which is higher than 455° C. and lower than the strain point of the glass substrate.

A laser processing method according to a seventeenth embodiment of the invention comprises the steps of: forming an amorphous silicon film on a glass substrate; introducing a metal element for promoting crystallization of silicon into the amorphous silicon film; making a first heat treatment of the amorphous film; then irradiating the crystallized silicon film with laser light; and then making a second heat treatment of the silicon film. This method is characterized in that one or both of the first and second heat treatments are made at a temperature which is higher than 50020 C. and lower than strain point of the glass substrate. This method is also characterized in that the laser irradiation step is performed while heating the substrate at a temperature which is higher than 455° C. and lower than the strain point of the glass substrate.

In the laser processing methods according to the eleventh through seventeenth embodiments described above, a silicon film formed on a glass substrate is irradiated with laser light. During the laser irradiation, the substrate is heated at a temperature which is higher than 455° C. and lower than strain point of the glass substrate.

The silicon film formed on the glass substrate can be an amorphous or crystalline silicon film directly formed on the glass substrate. Alternatively, an insulating film such as a silicon oxide film or silicon nitride film is formed as a buffer film on the glass substrate. An amorphous or crystalline silicon film is formed on the buffer film.

The substrate is heated above 455° C. during the laser irradiation to enhance the annealing effect of the laser irradiation. The silicon film is irradiated with laser light to impart energy to the silicon film. This energy crystallizes the silicon film, improves the crystallinity of the silicon film, or activates impurities contained in the silicon film. The heating is used together with the laser irradiation. This can enhance the effect of the laser irradiation.

We irradiated an amorphous silicon film with KrF excimer laser light having a wavelength of 248 nm to crystallize the amorphous silicon film. This amorphous silicon film was formed on a buffer film of silicon oxide film, which was, in turn, formed on a glass substrate. FIG. 22 shows the relation of the Raman intensity (relative value) of the silicon film to the energy density of incident laser light. The Raman intensity (relative value) is the ratio of the Raman intensity of the silicon film to the Raman intensity of single-crystal wafer. It follows that as the Raman intensity (relative value) is increased, the crystallinity is improved. It can be seen from the graph of FIG. 22 that a silicon film of higher crystallinity is obtained by heating the substrate (sample) while irradiating it with laser light, if the intensity of the laser light remains the same. FIG. 23 shows the relation of the half-value widths (relative values) of Raman spectra to the energy densities of incident light. The half-value width of a Raman spectrum is the ratio of the width giving a half value of the peak of the Raman spectrum to the width of the Raman spectrum obtained from the single-crystal wafer. It follows that as this half-value width is reduced, the obtained silicon film has higher crystallinity. As can be seen from the graph of FIG. 23, a silicon film having excellent crystallinity is obtained by heating the film while irradiating it with laser light at the same time. Our experiments have shown that the temperature of the heating conducted simultaneously with the laser irradiation is set higher than 455° C., preferably above 500° C. More preferably, the temperature is higher than 550° C. Where the heating is done above 500° C., conspicuous effects are obtained.

One method of heating the substrate can use a heater mounted in a holder or stage holding the substrate. Another method consists of heating the irradiated surface by infrared light or the like. Correctly, the heating temperature is the measured temperature of the irradiated surface. However, if slight error is tolerated, then the measured temperature of the substrate can be used as the heating temperature.

The heating done simultaneously with the laser irradiation is preferably carried out below the strain point of the glass substrate, because the substrate is prevented from warping or shrinking in spite of the heating. For example, Corning 7059 glass which is often used as the substrate of an active matrix liquid crystal display has a strain point of 593° C. In this case, it is desired to conduct the heat treatment at a temperature lower than 593° C.

Furthermore, it has been empirically known that during the laser irradiation, if the substrate is heated at a temperature of 550° C.±30° C., then desirable results arise.

Especially, if the silicon film is crystallized by heating before the laser irradiation, then conspicuous results are obtained. In the laser processing method according to the sixteenth embodiment described above, the amorphous silicon film formed on the glass substrate is first crystallized by heating. Then, the crystallinity is further enhanced by laser irradiation. Subsequently, the film is heat-treated. In this way, the defect density in the obtained silicon film is reduced.

In the laser processing method according to the seventeenth embodiment, a catalytic element for promoting crystallization of the amorphous silicon film is introduced into the silicon film. Then, a heat treatment is made to crystallize the amorphous film. The metal element for promoting crystallization can be one or more elements selected from the group consisting of Fe, Co, Ni, Ru, Rh, Pd, Os, Ir, Pt, Cu, and Au. Especially, where nickel (Ni) is used, a crystalline silicon film can be obtained by performing a heat treatment at a temperature of 550° C.±30° C. for about 4 hours.

One method of introducing the above-described element consists of forming either a layer of the metal element or a layer containing the metal element in contact with the surface of the amorphous silicon film by sputtering, evaporation, or CVD techniques. Another method of introducing the above-described element consists of applying a liquid solution containing the metal element to the surface of the amorphous silicon film and holding the metal element in contact with the surface of the amorphous silicon film.

The amount of the metal element introduced is so set that the concentration of the metal element in the silicon film is $1\times10^{16}$ cm$^{-3}$ to $5\times10^{19}$ cm$^{-3}$, for the following reason. If the concentration of the metal element is less than $1\times10^{16}$ cm$^{-3}$, then the desired effect cannot be obtained. Conversely, if the concentration of the metal element is in excess of $5\times10^{19}$ cm$^{-3}$, then the electrical characteristics of the semiconductor, or the obtained crystalline silicon film, are impaired. That is, the electrical characteristics of the film acting as a metal become more conspicuous.

Nickel element was introduced into several samples of amorphous silicon film. The samples were heat-treated to crystallize them. In this way, crystalline silicon films were derived. The spin densities in the films were measured. The results are listed in FIG. 24. It can be understood that the spin density in each film is a measure of the defect density in the film.

In FIG. 24, samples 1, 2, and 5 underwent only heat treatment after introduction of nickel element. Sample 3 underwent laser irradiation (LI) after heat treatment. Sample 4 underwent laser irradiation (LI) after heat treatment. Then, sample 4 was subjected to heat treatment. As can be seen from FIG. 24, sample 4 has the lowest spin density, it being noted that sample 4 underwent heat treatment after laser irradiation (LI).

In this way, heat treatment conducted after laser irradiation is quite effective in reducing the defect density in the film. If the temperature of the heat treatment performed after the laser irradiation is set above 500° C., then desirable results are produced. The upper limit of the temperature is restricted by the strain point of the glass substrate.

A laser processing system according to an eighteenth embodiment of the invention comprises: a conveyance chamber having a means for transporting a substrate; a first heating chamber having a means for heating the substrate; a second heating chamber for heating the substrate; and a laser processing chamber having a means for directing laser light to the substrate. The first heating chamber, the second heating chamber, and the laser processing chamber are connected together via the conveyance chamber. In the first heating chamber, the substrate is heated at a desired temperature. In the laser processing chamber, the substrate which was heated in the first heating chamber is irradiated with the laser light while heated. In the second heating chamber, the substrate which was irradiated with the laser light in the laser processing chamber is heat-treated.

Examples of system having the above-described structure are shown in FIGS. 18–20. In FIG. 18, indicated by reference numeral 301 is a conveyance chamber having a means 314 (robot arm) for transporting a substrate 315. Heating chambers 305 and 302 have means for heating the substrate. A laser processing chamber 304 has means for directing laser light to the substrate.

A laser processing system according to a nineteenth embodiment of the invention comprises a means for irradiating a substrate with laser light and a means for rotating the substrate through 90 degrees. This system is characterized in that the laser light has a linear cross section.

A laser processing system according to a twenty-first embodiment of the invention comprises a means for irradiating a substrate with laser light and a means for rotating the substrate through 90 degrees. This system is characterized in that the laser light has a linear cross section, and that this laser light of the linear cross section is scanned at right angles to longitudinal direction of the cross section of the laser light and directed to the substrate. The substrate is rotated through 90 degrees by the rotating means. Thus, the laser light of the linear cross section is scanned from an orientation differing by 90 degrees from the previous orientation and directed to the substrate.

A laser processing system according to a twenty-second embodiment of the invention comprises a means for irradiating a substrate with laser light and a means for rotating the substrate. This system is characterized in that the laser light has a linear cross section.

A laser processing system according to a twenty-third embodiment of the invention comprises a means for irradiating a substrate with laser light and a means for rotating the substrate. This system is characterized in that the laser light has a linear cross section, and that this laser light is scanned at right angles to longitudinal direction of the cross section of the laser light and directed to the substrate. The substrate is rotated by the rotating means so that the linear laser light is scanned at an orientation different from the previous orientation and directed to the substrate.

A laser processing system according to a twenty-fourth embodiment of the invention comprises: a laser light-irradiating chamber having means for producing laser light; a substrate-rotating chamber having a means for rotating a substrate; and a conveyance chamber connected to these two chambers and having a conveyance means for transporting the substrate. This system is characterized in that the laser light has a linear cross section, and that the linear laser light is scanned at right angles to longitudinal direction of cross section of the laser light and directed to the substrate. Once the substrate is irradiated with the laser light, the substrate is transported into the rotating chamber by the conveyance means and rotated by the rotating means. Then, the substrate is again transported into the laser light-irradiating chamber by the conveyance means. The substrate is again scanned with the laser light but at an angle different from the angle at which the laser light was emitted previously.

Examples of laser processing system having the above-described structure are shown in FIGS. 18–20. Systems shown in FIGS. 18–30 have means for producing laser light in a laser processing chamber 304. In FIG. 20, indicated by numeral 331 is a laser for emitting laser light. Also, there are provided means for rotating the substrate by 90 degrees in a chamber indicated by 303. Laser light from the laser 331 has a linear cross section whose longitudinal direction is directed from the front side of the sheet of FIG. 3 to the opposite side.

The substrate shown in FIG. 3 is placed on a stage 353. This stage is moved in the direction indicated by 354 so that the linear beam is scanned at right angles to the longitudinal direction of the beam. In the configuration shown in FIG. 3, the laser beam is scanned relative to the substrate by moving the substrate. Of course, the laser beam may be moved.

The laser irradiation can be repeated at least twice such that the direction of the scan of the linear laser beam is varied by 90 degrees from the direction of the previous scan. In this way, the whole desired surface can be uniformly irradiated with the laser light.

After the first laser irradiation step, the substrate is rotated through 90 degrees inside the chamber 303. Then, the second laser irradiation step is performed. This can enhance the uniformity of the effect of the laser irradiation. Of course, this scan can be repeated plural times.

Furthermore, the substrate can be rotated through 30 degrees. Three laser irradiation steps can be performed. Of course, the number of laser irradiation steps can be increased further. The angle through which the substrate is rotated can be set at will in view of the uniformity of the laser irradiation.

The twenty-fifth aspect of the present invention comprises:
 a step of introducing into an amorphous silicon film a metal element which promotes the crystallization of the amorphous silicon film;
 a step of heat treating the aforementioned amorphous silicon film to crystallize the amorphous silicon film; and
 a step of irradiating with laser light the silicon film crystallized at the preceding steps;
 wherein a sample is kept at a temperature within a range of±100° C. from the temperature at the aforementioned heat treatment.

In the aforementioned structure (of all the aspects disclosed in the specification), as a metal element promoting the crystallization, one kind of metal element or a plurality of kinds thereof can be selected such metal elements such as Fe, Co, Ni, Ru, Rh, Pd, Os, Ir, Pt, Cu, Zn, Ag and Au. Of these metal elements, nickel is a metal element that can provide the most conspicuous effect.

In the aforementioned structure, as a temperature at the time of heat treatment, a temperature in the range of from 450 to 750° C. can be selected. An upper limit of this temperature is limited by the heat resistance temperature of the substrate. When a glass substrate is used as the substrate, about 600° C. is considered to be the upper limit. Further, when the productivity is considered, it is desirable that this temperature is 550° C. or more. Consequently, it follows that when the glass substrate is used, it is desirable to heat treat the glass substrate at about 550 to 600° C.

It is desirable to set the heating temperature at the time of laser light irradiation to about 550 to 600° C. However, heating at a temperature of about 450° C. or higher is practical. Consequently, it is preferable to heat the glass substrate at a temperature within the scope of 550° C.±100° C.

Further, the twenty-sixth aspect according to the present invention comprises:
 a step of introducing into an amorphous silicon film a metal element which promotes the crystallization of the amorphous silicon film;
 a step of heat treating the aforementioned amorphous silicon film at 600° C. or less to crystallize the amorphous silicon film; and
 a step of irradiating with laser light the silicon film crystallized at the previous steps with a sample being kept at a temperature within a range of±100° C. from the temperature at the time of the aforementioned heat treatment.

Further, the twenty-seventh aspect according to the present invention comprises:
 a step of introducing into an amorphous silicon film a metal element which promotes the crystallization of the amorphous silicon film;
 a step of heat treating the aforementioned amorphous silicon film to crystallize the amorphous silicon film;
 a step of doping impurity ions into at least part of the silicon film crystallized at the preceding steps; and
 a step of irradiating with laser light an area into which the aforementioned impurity ions are doped with a sample being kept at a temperature within a range of ±100° C. from the temperature at the time of the aforementioned heat treatment.

Further, another aspects according to the present invention comprises:

irradiating with laser light having a linear beam configuration an amorphous silicon film into which a metal element which promotes the crystallization of the amorphous silicon film is introduced by moving the amorphous silicon film successively from one side of the amorphous silicon film to other side; and successively crystallizing an area irradiated with laser light;

wherein the aforementioned laser light irradiation is carried out by heating to 450° C. or more a surface free from laser light irradiation.

In the aforementioned structure, a necessary area can be effectively irradiated with laser light by successively moving a linear beam to irradiate the area with the linear beam. Further, the condition of the temperature (heating temperature) on a surface to be irradiated with laser light is that the temperature is normally limited to about 600° C. However, this temperature is limited by the material quality of the substrate. Otherwise, a much higher temperature may be set.

BRIEF DESCRIPTION OF THE DRAWINGS

FIG. 5 is a ray diagram of the laser optical system of the laser processing system of Example 1;

FIG. 24 is a list showing relation between the manufacturing condition of the crystalline silicon film and the spin density of the crystalline silicon film.

DETAILED DESCRIPTION OF THE PREFERRED EMBODIMENTS

Embodiment 1

Figure 1:
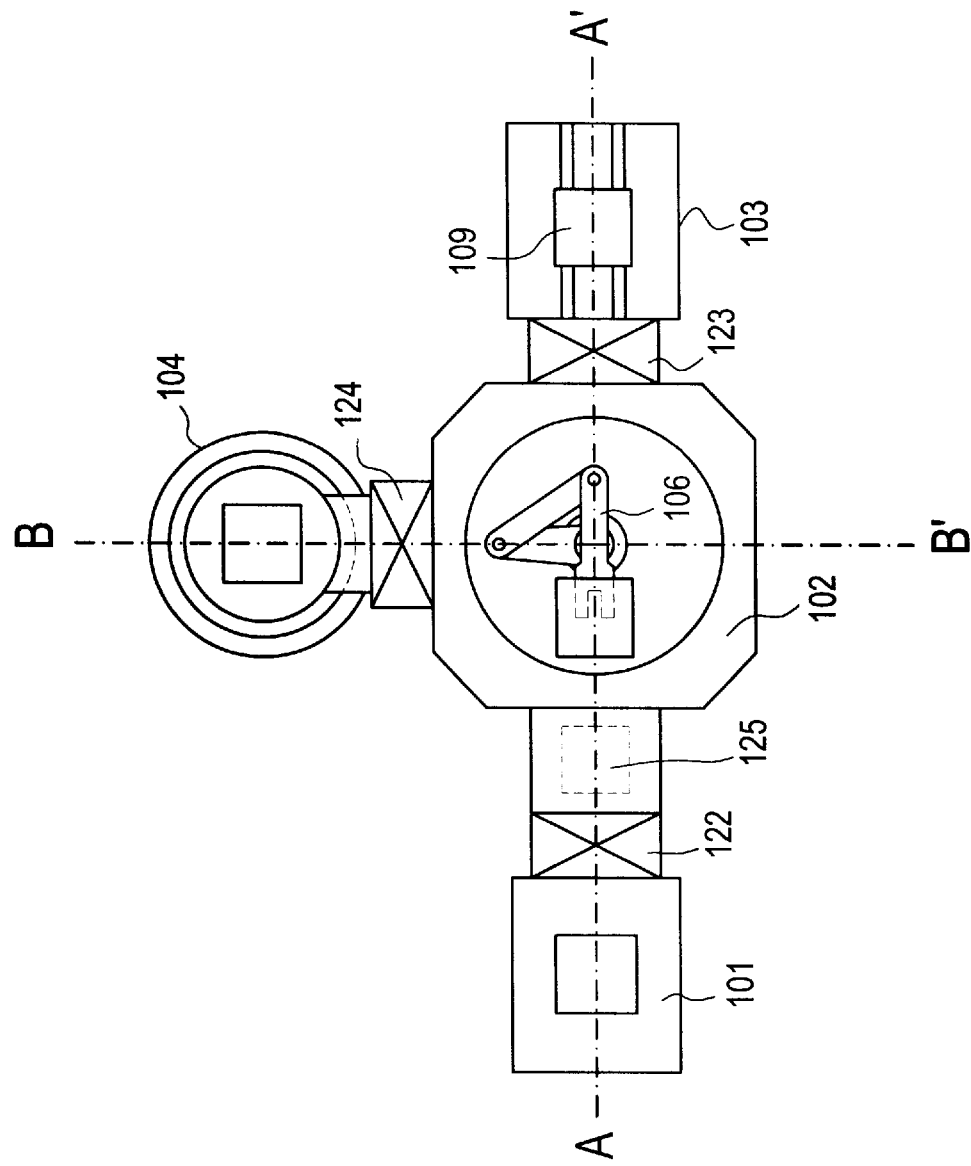
FIG. 1 is a top view of a laser processing system of Example 1 of the present invention.
Figure 2:
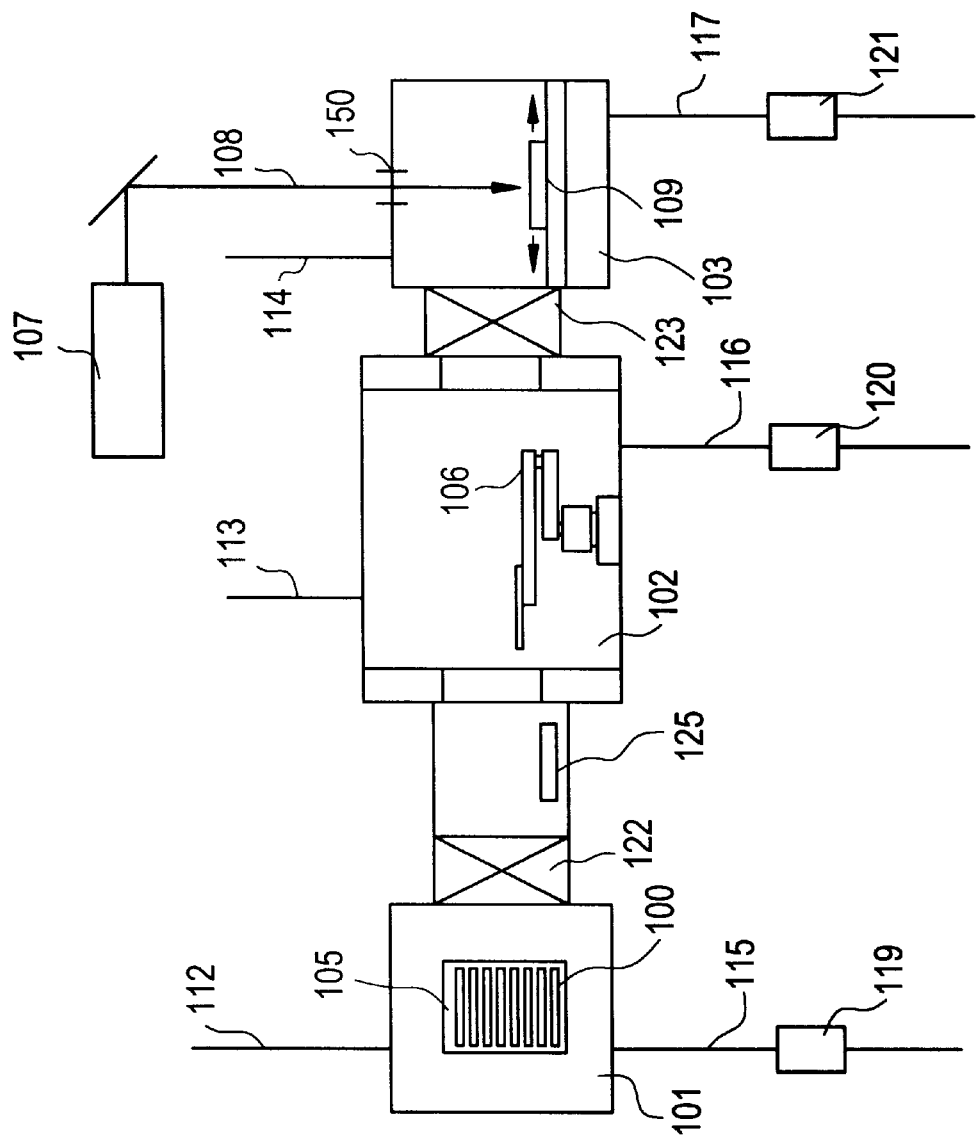
FIG. 2 is a cross-sectional view of the laser processing system of Example 1.
Figure 3:
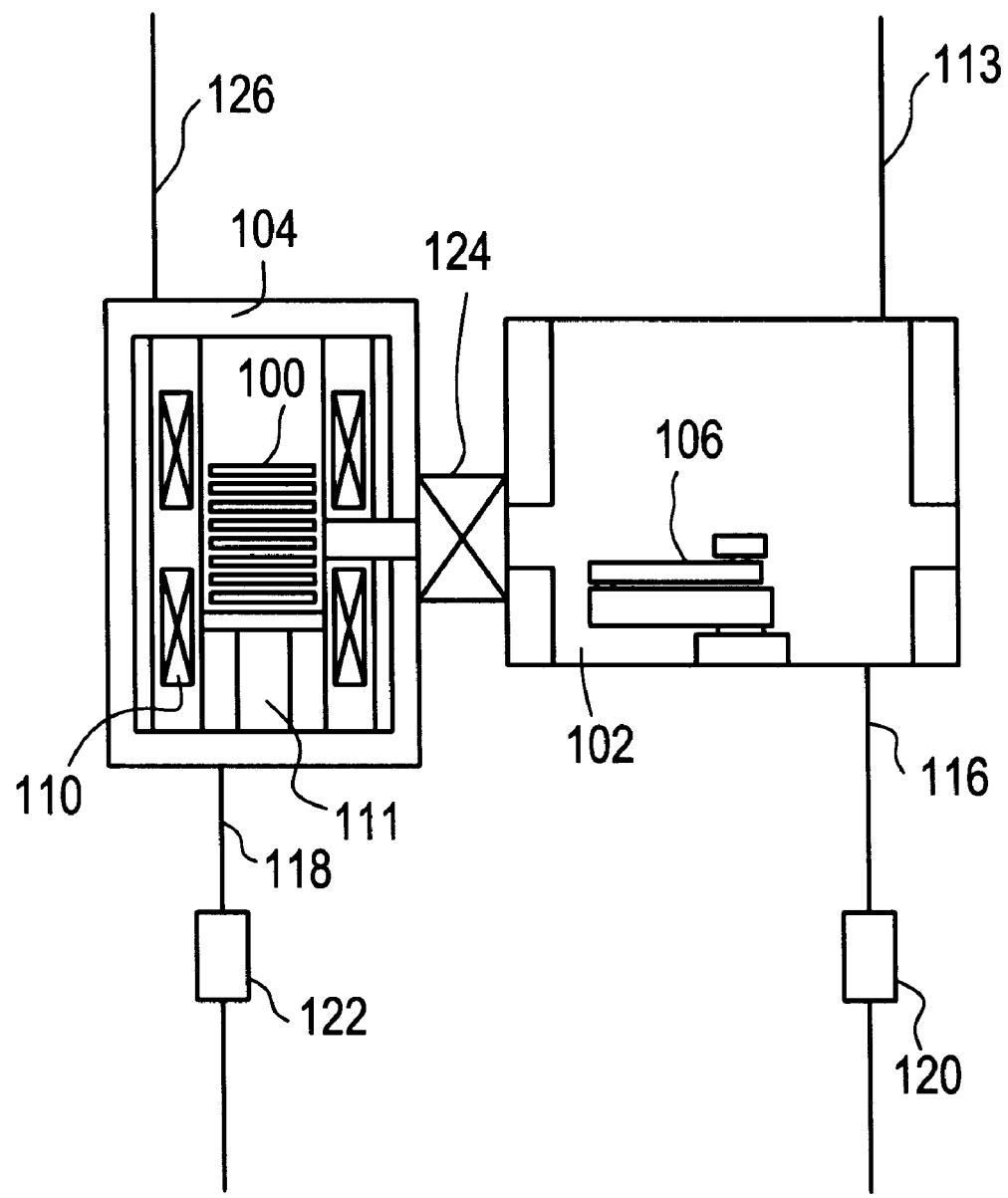
FIG. 3 is a cross-sectional view of the laser processing system of Example 1.
Figure 4:
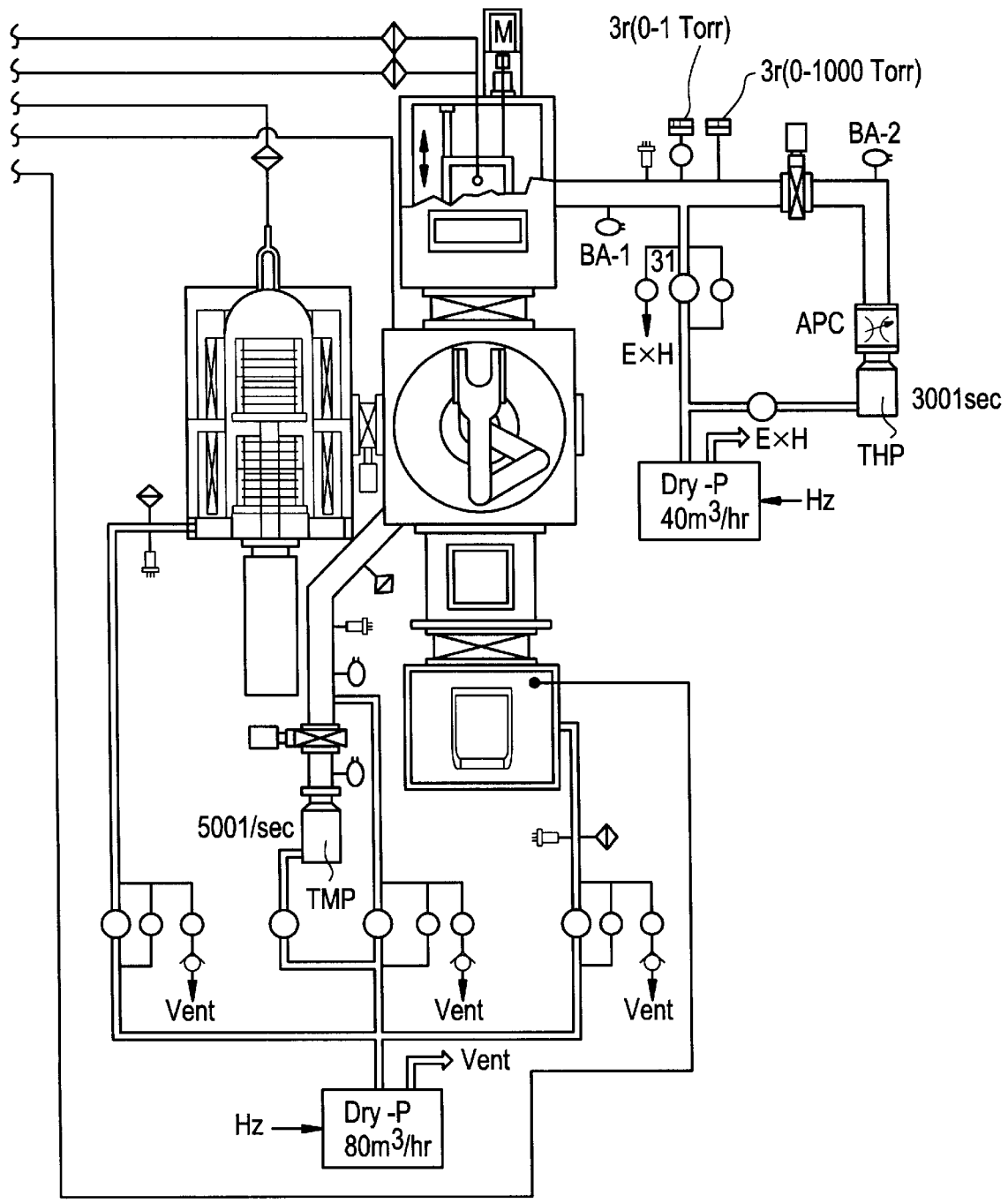
FIG. 4 is a block diagram of the laser processing system of Example 1.

In Embodiment 1, there is shown an apparatus for laser processing according to the present invention. FIG. 1 shows a top view of the apparatus for laser processing. FIG. 2 shows a sectional view taken along line A–A' of FIG. 1. FIG. 3 shows a sectional view taken along line B–B' of FIG. 1. Further, FIG. 4 shows a block diagram of the apparatus for laser processing.

In FIGS. 1 to 3, reference numeral 101 denotes a carry-in and conveyance chamber for carrying in and conveying a substrate (sample). In the carry-in and conveyance chamber, there is accommodated in a cassette 105 a large number of substrates 100. On each of the substrates 100, a silicon film to be irradiated with laser light and a thin-film transistor in the midst of the fabrication step are formed. When the substrates are carried in and out of the substrate carry-in and conveyance chamber 101, the whole cassette 105 which accommodates the substrates 100 are moved.

Reference numeral 102 denotes a conveyance chamber for conveying the substrates in the apparatus. The conveyance chamber is provided with a robot arm for conveying the substrates one by one. This robot arm 106 incorporates heating means and is designed to keep the substrate temperature (sample temperature) on a constant level even while conveying the substrates.

Further, reference numeral 125 denotes an alignment means for positioning the substrates, the means having a function of accurately positioning the robot arm with respect to the substrates.

A chamber denoted by reference numeral 103 is a chamber for irradiating the substrates with laser light. In this chamber, the laser light 108 emitted from the apparatus 107 for laser light irradiation can be applied to the substrates arranged on a stage 109 on which each of the substrates is to be placed via a synthetic quartz window 150. The stage 109 is provided with means for heating the substrates. As designated by an arrow, the stage 109 has a function of moving in a one dimension direction.

The apparatus for laser light irradiation 107 has a function of exciting, for example, KrF excimer laser, and incorporates an optical system shown in FIG. 5. The laser light is formed into a linear beam having a width of from several mm to several cm and a length of tens of cm by passing through the optical system shown in FIG. 5.

A chamber denoted by reference numeral 104 is a heating chamber for heating the substrates (samples), the chamber accommodating a large number of substrates 100. A large number of substrates 100 accommodated in the heating chamber are heated to a predetermined temperature with heating means (resistance heating means). The substrates 100 are accommodated on a lift 111. When needed, the lift 111 is moved up and down so that the substrates can be conveyed by the robot arm 106 in the conveyance chamber 102.

Each chamber has a closed structure, and can assume a reduced pressure state, or a high vacuum state by exhaust systems 115 to 118. Each of the exhaust systems is provided with individual vacuum pump 119 to 122 respectively. Further, each chamber is provided with gas supply systems 112 to 114 and 126 respectively for supplying required gas (for example, inert gas). Further, each chamber is provided with gate valves 122 to 124 to heighten independently the air-tightness of each chamber.

Embodiment 2

Figure 12A:
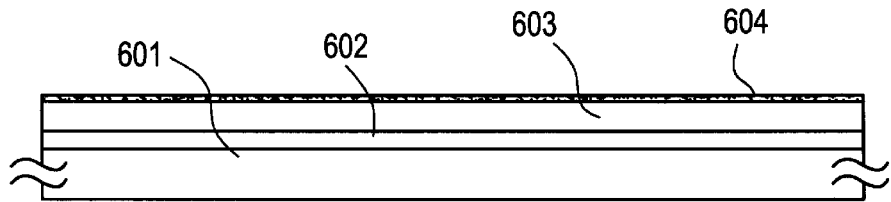
FIGS. 12(A)–12(D) are cross-sectional views illustrating steps for forming a crystalline silicon film on a substrate according to Example 6 of the invention.
Figure 12B:
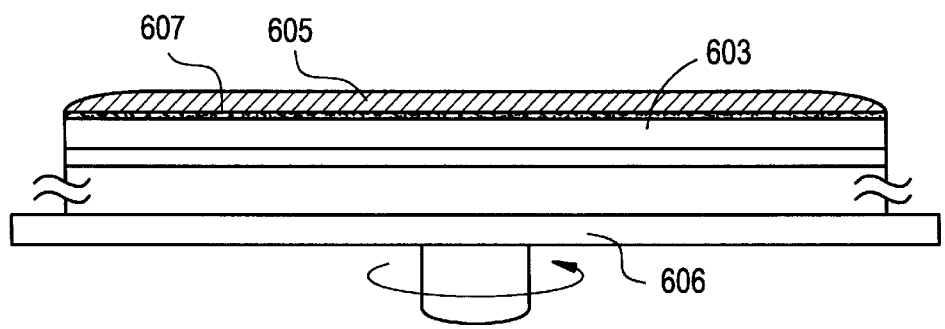

In embodiment 2, there is shown an example in which the thin-film transistors are fabricated using a method for laser processing according to the present invention. FIG. 12 shows steps of fabricating thin-film transistors until a crystalline silicon film is obtained. In the beginning, as shown in FIG. 12(A), a glass substrate 601 is prepared. A silicon oxide film 602 is formed to a thickness of 3000 Å as a base film on the surface of the glass substrate by the sputtering process. As the glass substrate, for example, Corning 7059 glass substrate can be used.

Next, an amorphous silicon film (a-Si film) 603 is formed to a thickness of 500 Å by the plasma CVD or reduced pressure thermal CVD. Then, an extremely thin oxide film 604 is formed by the UV light irradiation in the atmosphere of oxidation characteristics. This oxide film 604 is used for improving the moisture characteristics of a solution in the following solution coating step. The thickness of the oxide film 604 may be preferably set to about tens of angstroms (FIG. 12 (A)).

Next, nickel (Ni) is introduced which is a metal element for promoting the crystallization of the amorphous silicon film 603. Here, a nickel acetate solution is used to introduce nickel element into a surface of the amorphous silicon film 601. Specifically, a nickel acetate solution which is adjusted to have a predetermined density of nickel is dripped to form a water film 605. Then a spinner 606 is used for performing spin drying operation thereby realizing a state in which nickel element contacts the surface of the amorphous silicon film. The introduced amount of nickel is controlled by adjusting the density of nickel element in the nickel acetate solution. (FIG. 12(B))

Next, the amorphous silicon film 603 is crystallized by heat treating the amorphous silicon film 603 thereby providing a crystalline silicon film 607. The heat treatment at this time may be carried out at a heating temperature of about 450 to 750° C. However, when the problem of heat resistance of the glass substrate is considered, the heat treatment is required to be carried out at 600° C. or lower. Further, when the temperature is 500° C. or lower, time required of the crystallization is tens of hours or more, which is disadvantageous from the viewpoint of productivity. Here, in view of the problem of heat resistance of the glass substrate and the problem of heat treatment time, the substrate is subjected to four hour heat treatment at 550° C. Thus, the crystalline silicon film 607 is obtained. (FIG. 12(C))

Figure 12C:
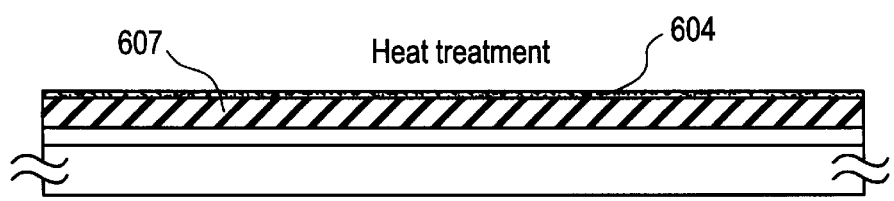

When the crystalline silicon film 607 is obtained by heat treatment, the crystalline silicon film 607 is irradiated with laser light using the apparatus for laser light irradiation shown in FIGS. 1 to 3 to further promote the crystallization of the crystalline silicon film 607. An outline of the steps of laser processing is shown hereinbelow. In the beginning, a cassette 105 accommodating a large number of substrates (samples) having a state shown in FIG. 12(C) is accommodated in a substrate carry-in and conveyance chamber 101. Then, each chamber is evacuated to produce a high vacuum state. Further, the gate valve is to be completely closed. Then the gate valve 122 is opened, and one substrate 100 is taken out of the cassette 105 with the robot arm 106 and is moved to the conveyance chamber 102. Then the gate valve 124 is opened and the substrate held in the robot arm 106 is conveyed to a heating chamber 104. At this time, the heating chamber 104 is to be preliminarily heated so as to heat the substrate to a predetermined temperature.

After the substrate is carried into the heating chamber 104, the next substrate is taken out of the cassette 105 and is conveyed to the heating chamber 104. By repeating the aforementioned operation predetermined number of times, all the substrates accommodated in the cassette 105 are accommodated in the heating chamber 104. All the substrates accommodated in the cassette 105 are accommodated in the heating chamber 104 followed by closing the gate valves 122 and 124.

After a predetermined duration of time has passed, the gate valve 124 is opened, and the substrate heated to a predetermined temperature (here at 500° C.) is drawn into the conveyance chamber 102 with the robot arm 106. At this time, the substrate is kept at 500° C. during the conveyance by heating means incorporated in the robot arm 106. Then, the gate valve 124 is closed. Further, the gate valve 123 is opened and this heated substrate is conveyed to a chamber 103 for irradiating the substrate with laser light. Then, the gate valve 123 is closed.

As the laser light, linear laser light is used. A predetermined area is irradiated with the laser light by moving the substrate stage 109 in the widthwise direction of the linear laser light at a state shown in FIG. 12(D). Here, in a state shown in FIG. 12(D), the substrate stage 109 is moved to irradiate the substrate with laser light so that the laser light sweeps the substrate from the right end of the substrate to the left end thereof. Here, the transfer speed of the substrate stage 109 is set to 10 cm/min. In embodiment 2, the laser light is irradiated while the temperature of the substrate stage 109 is kept at 500° C.

After the completion of the laser light irradiation, the gate valve 123 is opened, and the substrate held in the substrate holder is conveyed to the conveyance chamber 102 with the robot arm 106, followed by closing the gate valve 123. Then, the gate valve 122 is opened, and the substrate is accommodated in the cassette 105 in the carry-in and conveyance chamber 101. After this, the gate valve 122 is closed.

All the substrates accommodated in the heating chamber can be irradiated with laser light by repeating the aforementioned operation. After the completion of the irradiation of all the substrates with laser light, the substrates accommodated in the cassette 105 are taken out of the carry-in and conveyance chamber 101 to the outside of the apparatus together with the whole cassette accommodating the substrates.

Figure 12D:
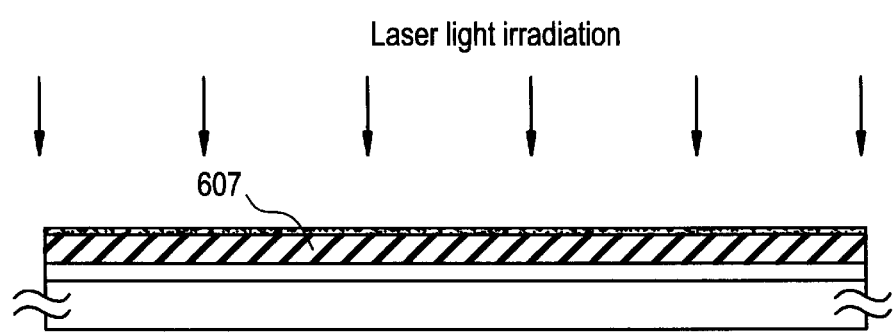
Figure 13A:
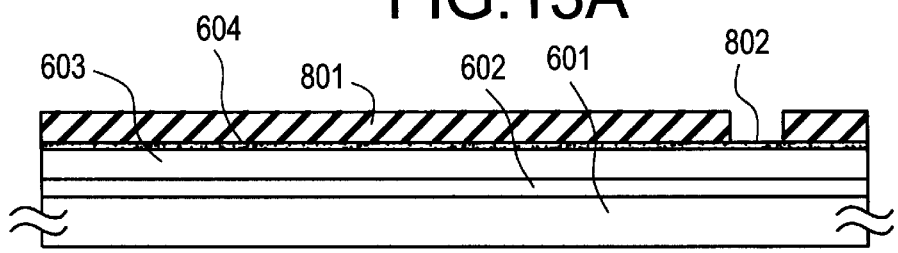
FIGS. 13(A)–13(D) are cross-sectional views illustrating steps for forming a crystalline silicon film on a substrate according to Example 7 of the invention.
Figure 13B:
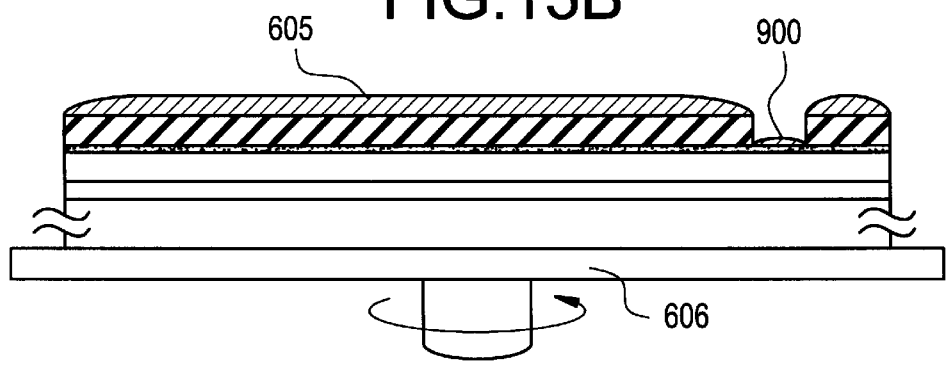
Figure 13C:
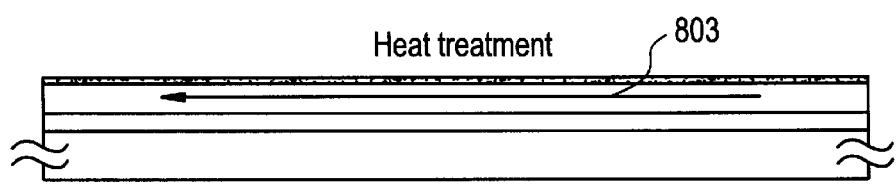
Figure 13D:
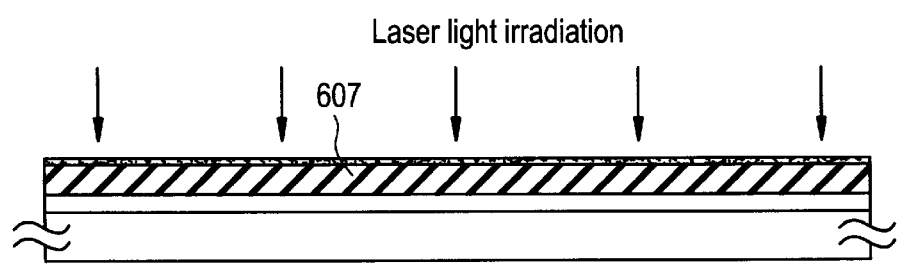

As shown in FIG. 12(D), an active layer 701 of the thin-film transistor is formed by promoting the crystallinity of the crystalline silicon film by laser light irradiation followed by patterning the film. Incidentally, the extremely thin oxide film 604 is removed at this time. (FIG. 7(A)).

Next, the silicon oxide film 702 which functions as a gate insulating film is formed to a thickness of 1000 Å by the sputtering process or by the plasma CVD. Then, an aluminum film containing 0.18 wt % of scandium (Sc) is formed to a thickness of 6000 Å by the vapor deposition process. Then, the film is patterned to form a gate electrode 703. When the gate electrode 703 is formed, the gate electrode 703 is subjected to anodic oxidation in an ethylene glycol solution containing 5% of tartaric acid by using the gate electrode 703 as an anode. Thus, an aluminum oxide film 704 is formed. The thickness of the aluminum oxide film 704 is set to about 2500 Å. The thickness of the aluminum oxide film 704 determines the length of the offset gate area formed in the subsequent step of impurity ion doping.

Further, impurity ions (phosphorus ions here in this embodiment) are doped into the active layer by the ion doping process or by the plasma doping process. At this time, the gate electrode 703 and the oxide layer 704 surrounding the gate electrode 703 serve as a mask so that impurity ions are doped into areas 705 and 709. Thus, the source area 705 and the drain area 709 are formed in self-alignment. Further, a channel formation area 707 and offset gate areas 706 and 708 are formed also in self-alignment.

Then, the source area 705 and the drain area 709 are recrystallized and the doped impurity is activated by the laser light irradiation. Strong light may be applied to the areas 705 and 709 in place of the laser light irradiation. The irradiation of the source/drain areas 705 and 709 with laser light is carried out by an apparatus shown in FIGS. 1 to 3. Further, in the laser light irradiation, the substrate is heated to 500° C.

After the completion of the annealing by the laser light irradiation, a silicon oxide film 710 is formed to a thickness of 7000 Å, as an interlayer insulating film by the plasma CVD. Then, after a hole drilling step is carried out, a source electrode 711 and a drain electrode 712 are formed by using an appropriate metal (for example, aluminum) or other appropriate conductive material. Lastly, in the atmosphere of hydrogen, the silicon oxide film is subjected to one hour heat treatment at 350° C. thereby completing a thin-film transistor shown in FIG. 7(C).

Embodiment 3

Embodiment 3 is an example in which a crystal is grown in a parallel direction on a substrate by selectively introducing a metal element promoting the crystallization of an amorphous silicon film into part of the surface of the amorphous silicon film whereby a thin-film transistor is fabricated by using a silicon film whose crystal has grown in parallel to each other on this substrate.

FIG. 13 shows steps until a crystalline silicon film is obtained. In the beginning, a silicon oxide film 602 is formed to a thickness of 3000 Å, as a base film on a glass substrate 601 by the sputtering process. Further, an amorphous silicon film 603 is formed to a thickness of 500 Å, by the plasma CVD or by the low pressure thermal CVD. Then, in the atmosphere of oxidation characteristics, an extremely thin oxide film 604 is formed on the surface of the amorphous silicon film 603. Then a resist mask 801 is formed by using a resist. The resist mask 801 is constituted so that the surface of the amorphous silicon film (on which an oxide film 604 is formed) in an area denoted by reference numeral 802 is exposed. The area denoted by reference numeral 802 has a rectangular shape (slit configuration) having a longitudinal side in a depthwise direction of FIG. 13. (FIG. 13(A)).

Next, after a nickel acetate solution is coated to form a water film 800, a spinner 608 is used for performing a spin drying operation. In this manner, there is realized a state in which nickel is arranged in contact with part 802 of the surface of the amorphous silicon film partially exposed by the resist mask 801. (FIG. 13(B)).

Next, the resist mask 801 is removed, and the substrate is subjected to four hour heat treatment at 550° C. At this step, nickel is diffused from the area 802. At the same time, a crystal is grown in a direction parallel to the substrate as shown by an arrow 803. This crystallization is performed by the progress of crystals in a needle-like, a column-like or a branch-like configuration. As a result of this crystallization, a crystalline silicon film is obtained in which crystals are grown in one or two dimensions in a direction parallel to the substrate. Here, since the area denoted by reference numeral 802 has a slit-like configuration with a longitudinal direction in the depthwise direction of FIG. 8, the crystal growth proceeds approximately in one dimension in a direction designated by an arrow 803. Incidentally, the crystal growth is carried out by about 50 to 200 μm in a direction indicated by an arrow 803. (FIG. 13(C)).

The crystal growth by heat treatment proceeds in a needle-like, a column-like or a branch-like configuration. However, the photographic observation under TEM (transmitting electron-beam microscope) shows that an amorphous component remains between crystal grown branches (a gap between the branches). The aforementioned residual amorphous component is crystallized and the crystallinity is further improved by annealing the amorphous component by the laser light irradiation.

This annealing by the laser light irradiation can be performed in the same manner as the embodiment. In this manner, a crystalline silicon film 607 in which the crystallinity is promoted can be obtained. (FIG. 13(D)).

Figure 7A:
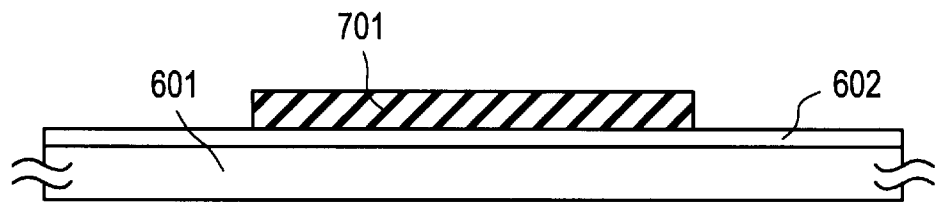
FIGS. 7(A)–7(C) are cross-sectional views illustrating steps for forming a thin-film transistor according to Example 2.
Figure 14A:
FIGS. 14(A)–14(C) are cross-sectional views illustrating steps for forming a thin-film transistor according to Example 7.

Next, the crystalline silicon film 607 is patterned to provide an active layer 701 as shown in FIG. 7(A). At this time, it is important that the starting point of the crystal growth and the end point of the crystal growth do not exist in the active layer 701. The purpose thereof is to form an active layer by avoiding areas having a high density of metal element because the density of the introduced metal element (nickel in this case) is high at the starting point and the end point of the crystal growth. This enables avoiding the instability of devices under the influence of the metal element. (FIG. 14(A)).

Next, the silicon oxide film 702 which functions as a gate insulting film is formed to a thickness of 1000 Å by the sputtering process or by the plasma CVD. Next, an aluminum film containing 0.18 wt % of scandium is formed to a thickness of 6000 Å by the electron beam vapor deposition.

Then, the aluminum film is patterned to form a gate electrode 703. When the gate electrode 703 is formed, the gate electrode is subjected to anodic oxidation in an ethylene glycol solution containing 5% of tartaric acid using the gate electrode 703 as an anode thereby forming an oxide layer 704 of aluminum. The thickness of the oxide layer 704 is set to be about 2500 Å. The thickness of the oxide layer 704 determines the length of the offset gate area formed at the following step of the impurity ion doping.

Figure 14B:
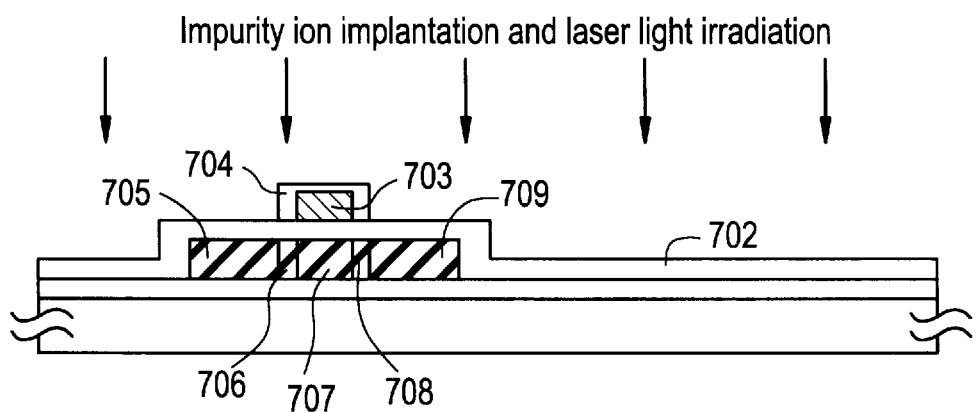

Further, impurity ions (phosphorus here in this embodiment) are doped into the active layer by the ion doping process or by the plasma doping process. At this time, the gate electrode 703 and the oxide layer 704 surrounding the gate electrode 703 serve as a mask to dope impurity ions into the areas 705 and 709. In this manner, the source area 705 and the drain area 709 are formed in self-alignment. Further, the channel formation area 707 and the offset gate areas 706 and 708 are formed also in self-alignment. (FIG. 14(B)).

Then, the apparatus for laser processing shown in FIGS. 1 to 3 are used for the laser light irradiation to recrystallize the source area 705 and the drain area 709 and to activate the doped impurities.

Figure 14C:
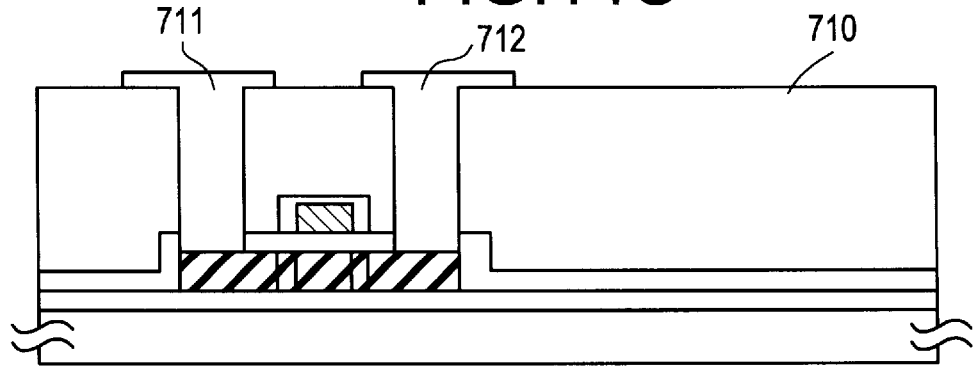

After the completion of annealing by the laser light irradiation, the silicon oxide film 710 is formed to a thickness of 7000 Å as an interlayer insulating film by the plasma CVD. Then, after the hole drilling step is carried out, the source electrode 711 and the drain electrode 712 are formed using an appropriate metal (for example, aluminum) and other appropriate conductive material. Lastly, in the atmosphere of hydrogen, the silicon oxide film 710 is subjected to one hour heat treatment at 350° C. to complete a thin-film transistor shown in FIG. 14(C).

In the thin-film transistor shown in Embodiment 3, since carriers move along a direction of the growth of crystals that have grown in a needle-like, a column-like or a branch-like configuration in one dimension, the transistor is affected by the crystal grain boundary at the time of carrier transfer with the result that crystals can be obtained which have a large carrier transfer degree.

Embodiment 4

Embodiment 4 is characterized by forming a crystalline area which is regarded as a single crystal or a crystal extremely approximate to the single crystal by the laser light irradiation using a metal element promoting the crystallization of an amorphous silicon film followed by forming an active layer of a thin-film transistor by using the area.

FIG. 15 shows a step for forming a crystalline area which can be regarded as a single crystal or a crystal extremely approximate to the single crystal. In the beginning, a silicon oxide film 602 is formed as a base film on a glass substrate 601 to a thickness of 3000 Å by the sputtering process. Further, the amorphous silicon film 603 is formed to a thickness of 500 Å by the plasma CVD or the low pressure CVD. Then, in the atmosphere of oxidation characteristics, the amorphous silicon film is irradiated with UV light to form an extremely thin oxide film 604 on a surface of the amorphous silicon film 603. Then, the resist is used to form a resist mask 801. The resist mask 801 is constituted so that the surface of the amorphous silicon film (on which an oxide film 604 is formed) is exposed in an area denoted by reference numeral 802. The area denoted by reference numeral 802 has a rectangular shape (slit configuration) having a longitudinal side in the depthwise direction of FIG. 10. (FIG. 15(A)).

Next, after a nickel acetate solution is coated to form a water film 800, a spinner 606 is used for performing a spin drying operation. Thus, there is realized a state in which a nickel is arranged in contact with the part 802 of the surface of the amorphous silicon film partially exposed by the resist mask 801. Incidentally, there is shown in this embodiment an example in which the resist mask 801 is used. However, a silicon oxide film or the like may be used as a mask. (FIG. 15(B)).

Then, the resist mask 801 is removed to irradiate the film with laser light by using the apparatus shown in FIGS. 1 to 3. In the laser light irradiation, while the sample is heated to 500° C., the linear laser light 810 is moved (swept) in a direction designated by reference numeral 811 so that the backward direction of FIG. 10 constitutes a longitudinal direction. This transfer speed is set to an extremely slow one on the order of 1 mm to 10 cm/min. At this time, in the area denoted by reference numeral 812, a crystal nucleus or a crystalline area is formed by heating. The generation of the crystal nucleus or the formation of the crystalline area results from the action of nickel element.

When the linear laser light is moved as denoted by reference numeral 811, crystals are grown from an area 812 into which an extremely small amount of nickel is introduced as denoted by reference numeral 813. The crystal growth denoted by reference numeral 813 proceeds from the area 812 where the crystal nucleus or the crystal area is formed in epitaxial growth or in a state that can be regarded the epitaxial growth. (FIG. 15(C)).

This crystallization is carried out as a result of the melting of the area irradiated with the laser light or by the epitaxial growth (or a growth that can be regarded as the epitaxial growth) of crystals from the previously crystallized area to this melted area. This crystal growth successively proceeds as denoted by reference numeral 813 by moving the linear laser light 810 as denoted by reference numeral 811. Further, since nickel which is a metal element promoting the crystallization is deflected to an area in which silicon is melted, nickel element is concentrated at the tip of the crystal growth along with the progress of the crystallization denoted by reference numeral 813. Consequently, in the central part of the crystalline area 814, the density of nickel can be lowered.

Figure 15A:
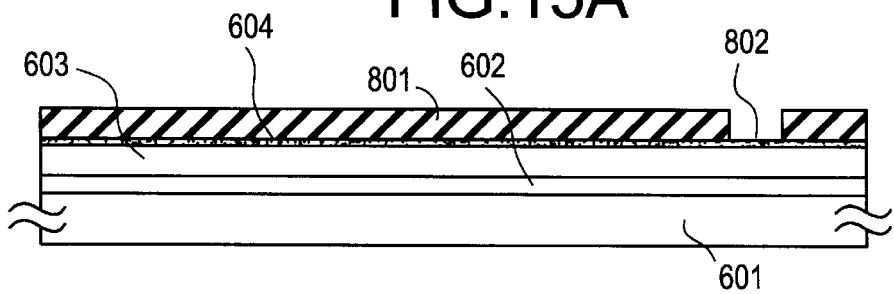
FIGS. 15(A)–15(D) are cross-sectional views illustrating steps for forming a crystalline silicon film on a substrate according to Example 8 of the invention.
Figure 15B:
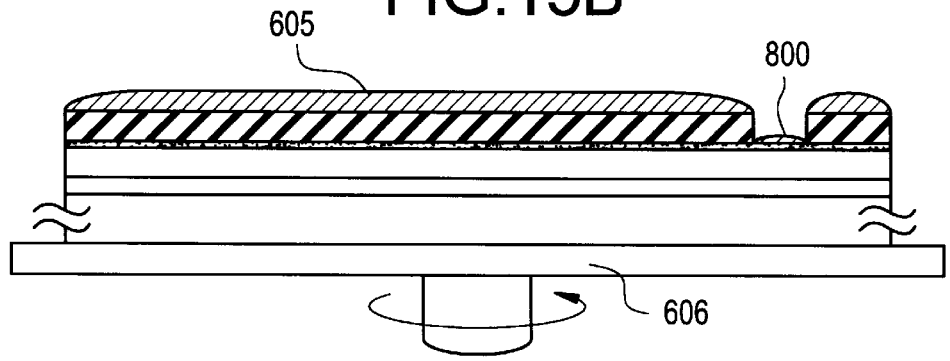
Figure 15C:
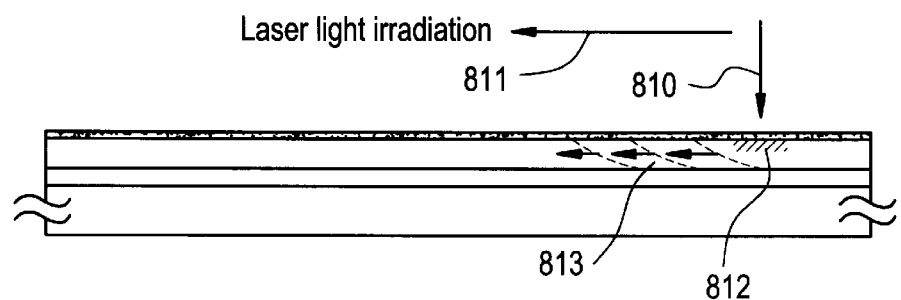

This step of the laser light irradiation will be explained hereinbelow. In the beginning, a cassette 105 which accommodates a large number of substrates having a state shown in FIG. 15(C) is accommodated in the substrate carry-in and conveyance chamber 101. Then, each chamber is evacuated to produce a high vacuum state. Further, the gate valve is placed in the completely closed state. Then, the gate valve 122 is opened, and one substrate 100 is taken out of the cassette 105 with the robot arm 106 and is transferred to the conveyance chamber 102. Then the gate valve 124 is opened and one substrate held in the robot arm 106 is conveyed to the heating chamber 104. At this time, the heating chamber 104 is preliminarily heated to a predetermined temperature (500° C.) so as to heat the substrate.

After the substrate is carried in the heating chamber 104, the next substrate is taken out from the cassette 105 with the robot arm 106 again and conveyed to the heating chamber 104. By repeating the aforementioned operation a predetermined number of times, all the substrate accommodated in the cassette 105 are accommodated in the heating chamber 104.

Then, after the lapse of a predetermined time, the gate valve 124 is opened, and the substrate heated to a predetermined temperature (500° C. here in this embodiment) is drawn out to the conveyance chamber 102 with the robot arm 106. The substrate is kept at 500° C. during the conveyance by the heating means incorporated in the robot arm. Then the gate valve 124 is closed. Further, the gate valve 123 is opened and this heated substrate is conveyed to the chamber 103 for the laser light irradiation. Then, the gate valve 123 is closed.

As the laser light, linear laser light is used. A predetermined area of the substrate is irradiated with the laser light by moving the substrate stage 109 in the width direction of the laser light. Here, in a state of FIG. 12(D), the substrate is irradiated with the laser light by moving the substrate stage 109 from the right side of the substrate shown in FIG. 12(D) to the left side thereof so that the laser light sweeps the substrate. The transfer speed of the substrate stage 109 is set to 1 cm/min. In this embodiment, the substrate is irradiated with laser light while maintaining the temperature of the substrate stage at 500° C.

After the completion of the laser light irradiation, the gate valve 123 is opened, and the substrate held in the substrate holder is conveyed to the conveyance chamber 102 with the robot arm 106. Then, the gate valve 123 is closed. Next, the gate valve 122 is opened, and the substrate is accommodated in a cassette 105 in the substrate carry-in and conveyance chamber 101. After this, the gate valve 122 is closed.

All the plurality of substrates accommodated in the heating chamber are irradiated with laser light by repeating the aforementioned operation. After the irradiation of all the substrate with the laser light is completed, the substrates accommodated in the cassette 105 are taken out from the substrate carry-in and conveyance chamber 101 to the outside of the apparatus.

In this embodiment, time elapsed from the carrying the first substrate into the heating chamber 104 until the carrying the last substrate into the heating chamber 104 is regarded as being equal to time elapsed from taking out the first substrate from the heat chamber 104 to start to convey the substrate to the chamber 103 for laser light irradiation until taking out the last substrate to start to convey the substrate to the chamber 103 for laser light irradiation. With such a procedure, time during which the substrate is held in the heating chamber can be the same with respect to all the substrates.

On the substrate, an amorphous silicon film in which nickel element is introduced is formed as shown in FIG. 15(C). At 500° C., a crystal nucleus can be easily generated in a short time. In an area where nickel element is introduced, the crystallization easily proceeds. Consequently, setting to an equal value the time during which the substrate is held in the heating chamber 104 is important for obtaining a uniform crystalline silicon film.

In this manner, it is possible to obtain a single crystal, or an area 814 that can be regarded as a single crystal. The area that can be regarded as the single crystal contains $10^{16}$ to $10^{20}$ cm$^{-3}$ of hydrogen. The area has a structure in which the internal defect is terminated with hydrogen. (FIG. 15(D)).

This area can be regarded as a very large crystal grain. Further, this area can be further enlarged.

Figure 15D:
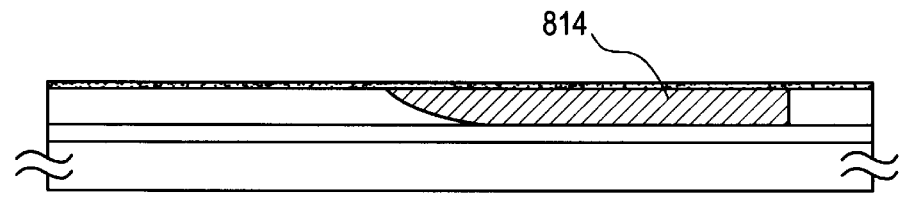
Figure 16A:
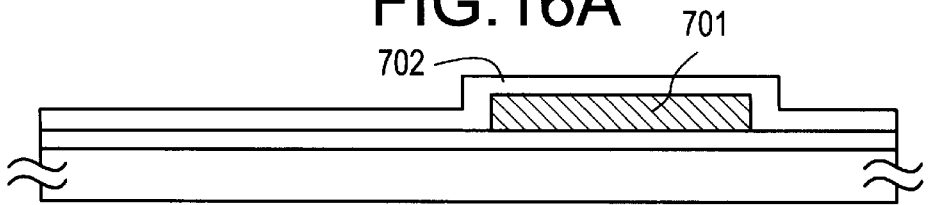
FIGS. 16(A)–16(D) are cross-sectional views illustrating steps for forming a thin-film transistor according to Example 8.
Figure 16B:
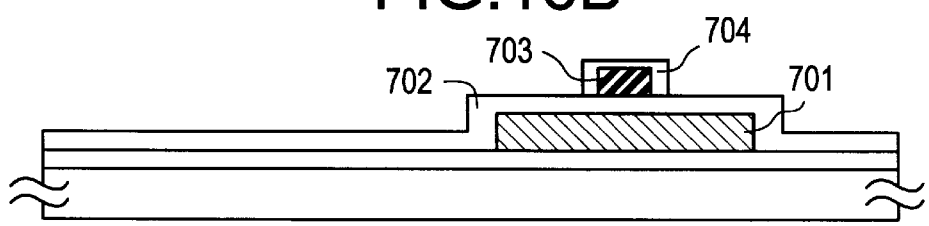
Figure 16C:
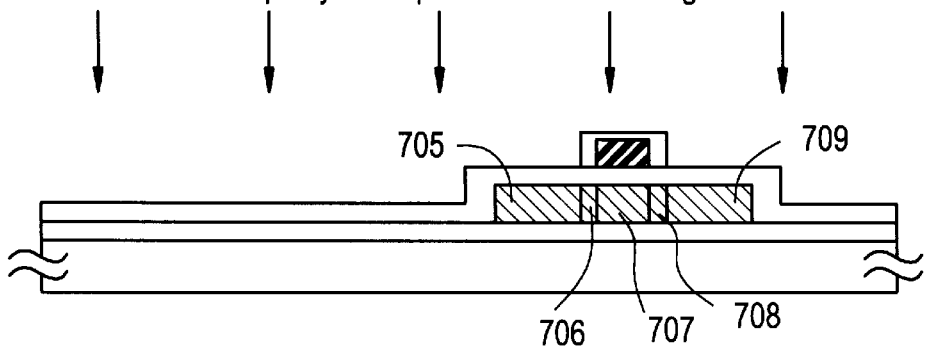

As shown in FIG. 15(D), in the case where the single crystal or the area 814 that can be regarded as the single crystal, an active layer of the thin-film transistor is formed by using these areas. In other words, the substrate is patterned to form an active layer denoted by reference numeral 701 in FIG. 16. Further, at the time of the patterning of the substrate, an extremely thin oxide film 802 is removed. Further, a silicon oxide film 702 which functions as a gate insulating film is formed to a thickness of 1000 Å by the sputtering process or by the plasma CVD. (FIG. 16(A)).

Next, an aluminum film containing 0.18 wt % of scandium is formed to a thickness of 6000 Å by the electron beam vapor deposition process. Then, the substrate is patterned to form a gate electrode 703. After the gate electrode 703 is formed, the gate electrode 703 is subjected to anodic oxidation in an ethylene glycol solution containing 5% of tartaric acid by using the gate electrode as an anode thereby forming an aluminum oxide layer 704. The thickness of this oxide layer 704 is set to about 2500 Å. The thickness of the oxide layer 704 determines the length of the offset gate area formed in the following step of impurity ion doping.

Further, impurity ions (phosphorus ions) are doped into the active layer by the ion doping process or by the plasma doping process. At this time, the gate electrode 703 and the oxide layer 704 surrounding the gate electrode 703 serve as a mask to dope impurity ions into areas 705 and 709. In this manner, the source area 705 and the drain area 709 are formed in self-alignment. Further, a channel formation area 707 and offset gate areas 706 and 708 are formed in self-alignment. (FIG. 16(C)).

Then, the laser processing apparatus shown in FIGS. 1 to 3 is used for the laser light irradiation to recrystallize the source area 705 and the drain area 709 and to activate the impurity.

After the completion of the annealing by the laser light irradiation, the silicon oxide film 710 is formed as an interlayer insulating film to a thickness of 7000 Å by the plasma CVD. Then, after a hole drilling step is carried out, the source electrode 711 and the drain electrode 712 are formed by using an appropriate metal (for example, aluminum) and other appropriate conductive material. Lastly, in the atmosphere of hydrogen, the substrate is subjected to one hour heat treatment at 350° C. to complete a thin-film transistor shown in FIG. 16(D).

In the thin-film transistor shown in this embodiment, an active layer is constituted by using a single crystal or an area that can be regarded as a single crystal. Thus, the crystal grain does not substantially exist in the active layer. Thus, the thin-film transistor is constituted so that the transistor is not affected by the crystal grain in the operation.

Figure 16D:
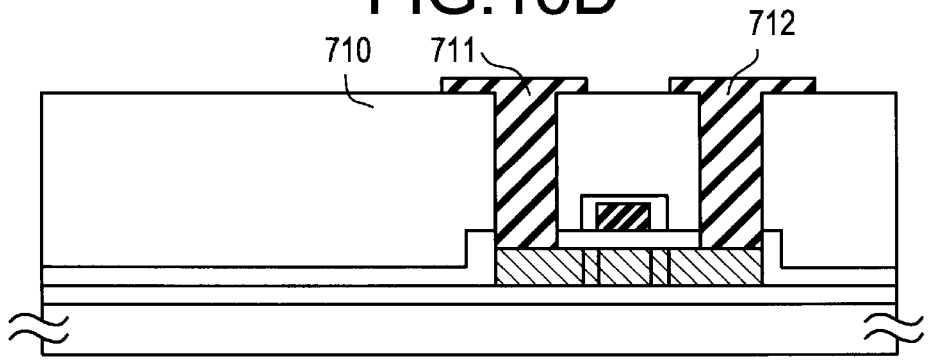

The structure shown in this embodiment can be effectively used in the case where a plurality of thin-film transistors arranged in a line are formed. For example, the structure can be used in the case where a plurality of thin-film transistors shown in FIG. 16(D) are fabricated at the same time in one line in the depthwise direction of FIG. 16. The structure formed by the arrangement of such a large number of thin-film transistors in a line can be used in a peripheral circuit (shift-resistor circuit or the like) of a liquid crystal electro-optical apparatus. Further, the thin-film transistor using a single crystal or a crystalline silicon film that can be regarded as a single crystal is useful for use in an analog buffer amplifier or the like.

Embodiment 5

Embodiment 5 is an example in which a mechanism of crystallization by the laser light irradiation is efficiently used to obtain a crystalline silicon film (with favorable crystallinity) which is more similar to a single crystal.

FIG. 17 shows the fabrication step of the embodiment. In the beginning, a base silicon oxide film 602 is formed to a thickness of 3000 Å on a glass substrate 601 by the sputtering process. Then, the amorphous silicon film 603 is formed to a thickness of 500 Å by the plasma CVD or the low pressure thermal CVD. Further, in the atmosphere of oxidation characteristics, the substrate is irradiated with UV light to form an extremely thin oxide film 604. Further, a silicon oxide film 815 is formed which constitutes the mask. This silicon oxide film 815 may be formed by the sputtering process or by the plasma CVD. The silicon oxide film 815 may be formed by using a coating solution for forming a silicon oxide film. This is a type which is cured by heating at about 100 to 300° C. For example, OCD (Ohka Diffusion Source) solution manufactured by Tokyo Applied Chemistry Co., Ltd. can be used. This silicon oxide film 815 has a slit-like configuration having a longitudinal direction in the depthwise direction of FIG. 12 in an area denoted by reference numeral 802. The silicon oxide film 815 is constituted so that the surface of the amorphous silicon oxide film 603 (on which the oxide film 604 is formed) is exposed in this slit-like configuration area 802. This slit-like configuration area may be provided with a width of several $\mu$ to tens of $\mu$ in a required length. (FIG. 17(A)).

Next, a nickel acetate solution is coated on the silicon oxide film to form a water film 800. Then, the spinner 606 is used for performing a spin drying operation to realize a state in which nickel element is provided on the surface of the amorphous silicon film 603 in contact with the surface of the amorphous silicon film 603 via an oxide film 604 in the area 802. (FIG. 17(B)).

Figure 17A:
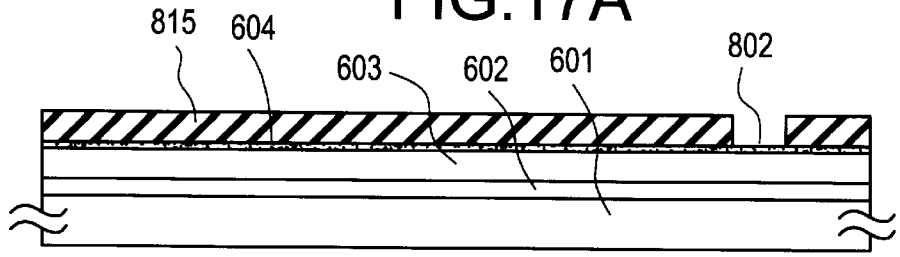
FIGS. 17(A)–17(D) are cross-sectional views illustrating steps for forming a crystalline silicon film on a substrate according to Example 9 of the invention.
Figure 17B:
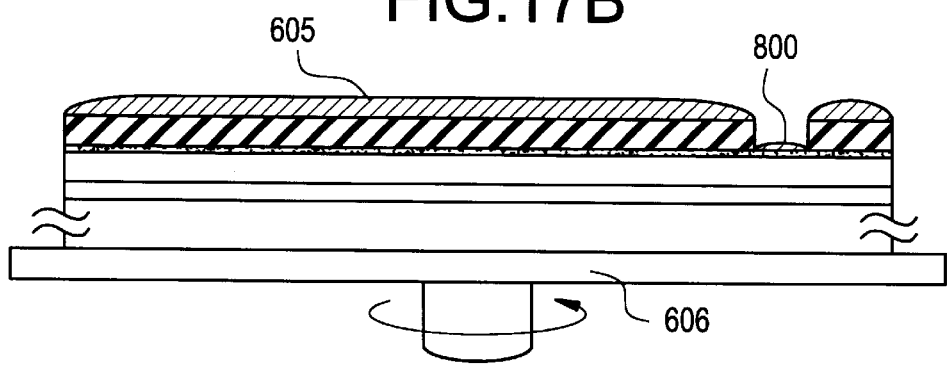
Figure 17C:
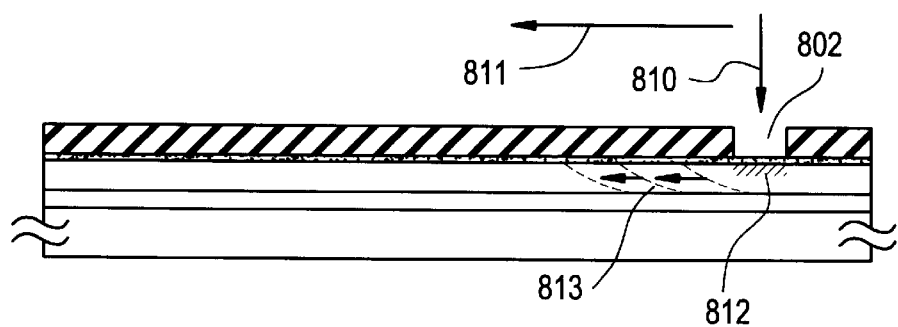

Then, as shown in FIG. 17(C), linear laser light 811 is applied to the substrate while moving (sweeping) in a direction denoted by reference numeral 811. This linear laser light is molded into a configuration having a longitudinal side in the depthwise direction of FIG. 12 by using an optical system shown in FIG. 5.

The irradiation of the substrate with the laser light 810 is performed by heating the sample at 500° C. and reducing the transfer speed to an extremely slow speed of about 1 mm to 10 cm/min. At this time, in the area denoted by reference 812, a crystal nucleus or a crystalline area is formed by heating. The generation of this crystal nucleus and the formation of the crystalline area result from the action of nickel element. The step of the laser light irradiation is the same as Embodiment 4.

When the linear laser light is irradiated while moving the laser light as shown by reference numeral 811, the area denoted by reference numeral 812 is rapidly cooled after the laser light irradiation because the silicon oxide does not on the surface. Since the amorphous silicon film to which the laser light has moved is vertically sandwiched between the upper and lower silicon oxide films, there is no place to which heat escapes with the result that the amorphous silicon film is instantly heated to a high temperature. This means that a cold area 812 having a crystal structure and a high temperature melted area exist. Naturally, a steep temperature gradient is generated between the two areas. Thus the crystal growth is promoted by the action of the temperature gradient so that the crystal growth that can be regarded as an epitaxial growth successively proceeds as denoted by reference numeral 813. Then, a single crystal or an area that can be regarded as a single area 814 can be obtained.

A structure shown in embodiment 5 enables realizing the facilitation of the growth start at the starting point and forming partially a single crystal or an area that can be regarded as the single crystal.

Figure 17D:
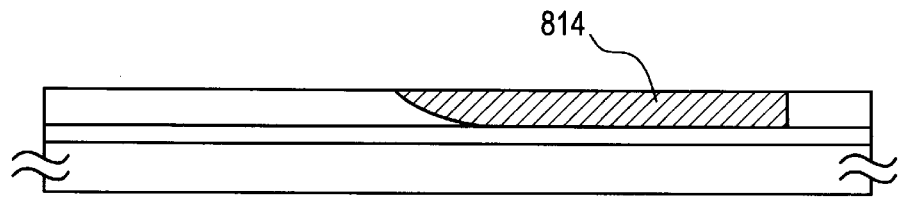

In this manner, a single crystal or an area that can be regarded as the single crystal denoted by reference numeral 814 of FIG. 17(D) can be obtained. This single crystal or an area that can be regarded as the single crystal can be formed over a length of tens of $\mu$m, and a single crystal thin film transistor can be formed by using the area.

Embodiment 6

Figure 11:
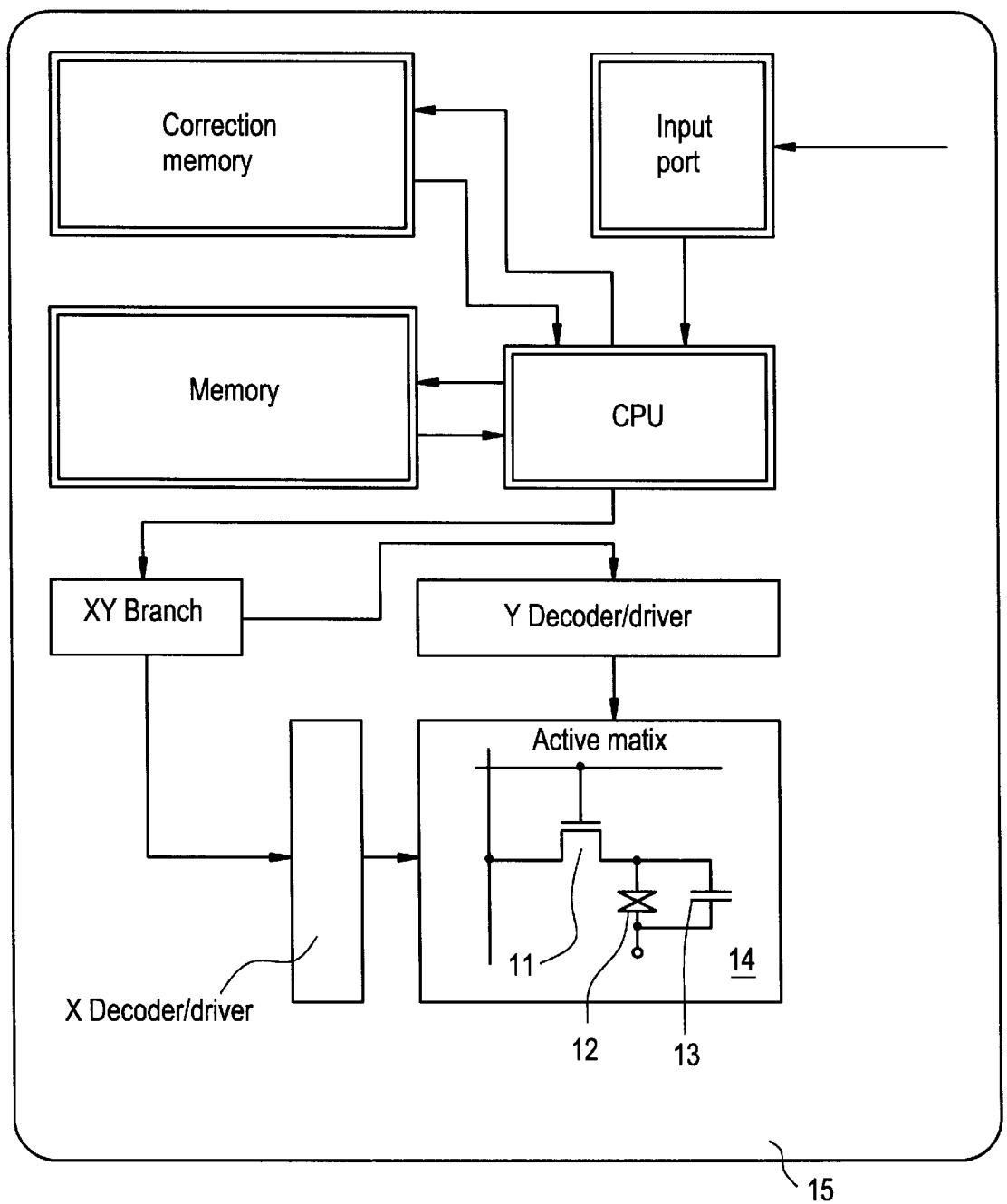
FIG. 11 is a schematic block diagram of a liquid crystal display according to Example 5 of the invention.

FIG. 11 shows an embodiment in which an active matrix type liquid crystal display system with a faster speed is constituted according to the present invention. The embodiment shown in FIG. 11 is an example in which a liquid crystal display is miniaturized, and reduced in weight and in thickness by fixing a semiconductor chip provided on a main board of a normal computer on at least one of a pair of substrates of a liquid crystal display having a structure in which a liquid crystal is sandwiched between the pair of substrates.

FIG. 11 will be explained hereinafter. A substrate 15 is a substrate of a liquid crystal display. On the substrate a TFT 11, a pixel electrode 12', an active matrix circuit 14 having a plurality of pixels providing an auxiliary capacity 13, an X decoder/driver, a Y decoder/driver, and XY branch circuit are formed of TFTs. The TFT according to the invention can be used.

Then, on the substrate 15, other chips are further mounted. Then, these chips are connected to the circuit on the substrate 15 with the wire bonding process, the chip on glass (COG) process or the like. Referring to FIG. 11, a correction chip, a memory, a CPU and an input port are chips provided in this manner. In addition to these chips, various other chips may be provided.

Referring to FIG. 11, the input port refers to a circuit for reading a signal input from the outside to convert the signal into an image signal. The correction memory refers to a memory peculiar to a panel for an input signal or the like corresponding to the characteristics of the active matrix panel. In particular, the correction memory has information peculiar to each pixel as a non-volatile memory and individually corrects the information. In other words, when there is a point defect in the pixel on the electro-optical apparatus, a signal corrected in accordance with the point defect is sent to the pixel surrounding the point thereby covering the point defect to obscure the defect. Otherwise, when the pixel is dark as compared with the surrounding pixels, a larger signal is sent by the pixel to provide the same brightness as the surrounding pixel with the dark pixel. Since the defect information differs from one panel to another, information accumulated in the correction memory differs from one panel to another.

The CPU and the memory has the same function as normal computers. In particular, the memory has an image memory which corresponds to each image as a RAM. These chips are all of the CMOS type.

In addition, at least part of the integrated circuits which are required may be constituted with one aspect of the present invention to further heighten the thin film of the system.

As described above, the CPU and even the memory are formed on the liquid crystal display substrate. Thus constituting an electronic apparatus like a personal computer on one substrate is very useful in miniaturizing a liquid crystal display apparatus and to widen the scope of application thereof.

The thin-film transistor which is fabricated according to the present invention can be used in a circuit which is required by a liquid crystal display systematized as shown in the embodiment. In particular, it is extremely useful to use the thin-film transistor which is fabricated by using a single crystal or an area that can be regarded as the single crystal in an analog buffer circuit or other required circuits.

Embodiment 7

Figure 25:
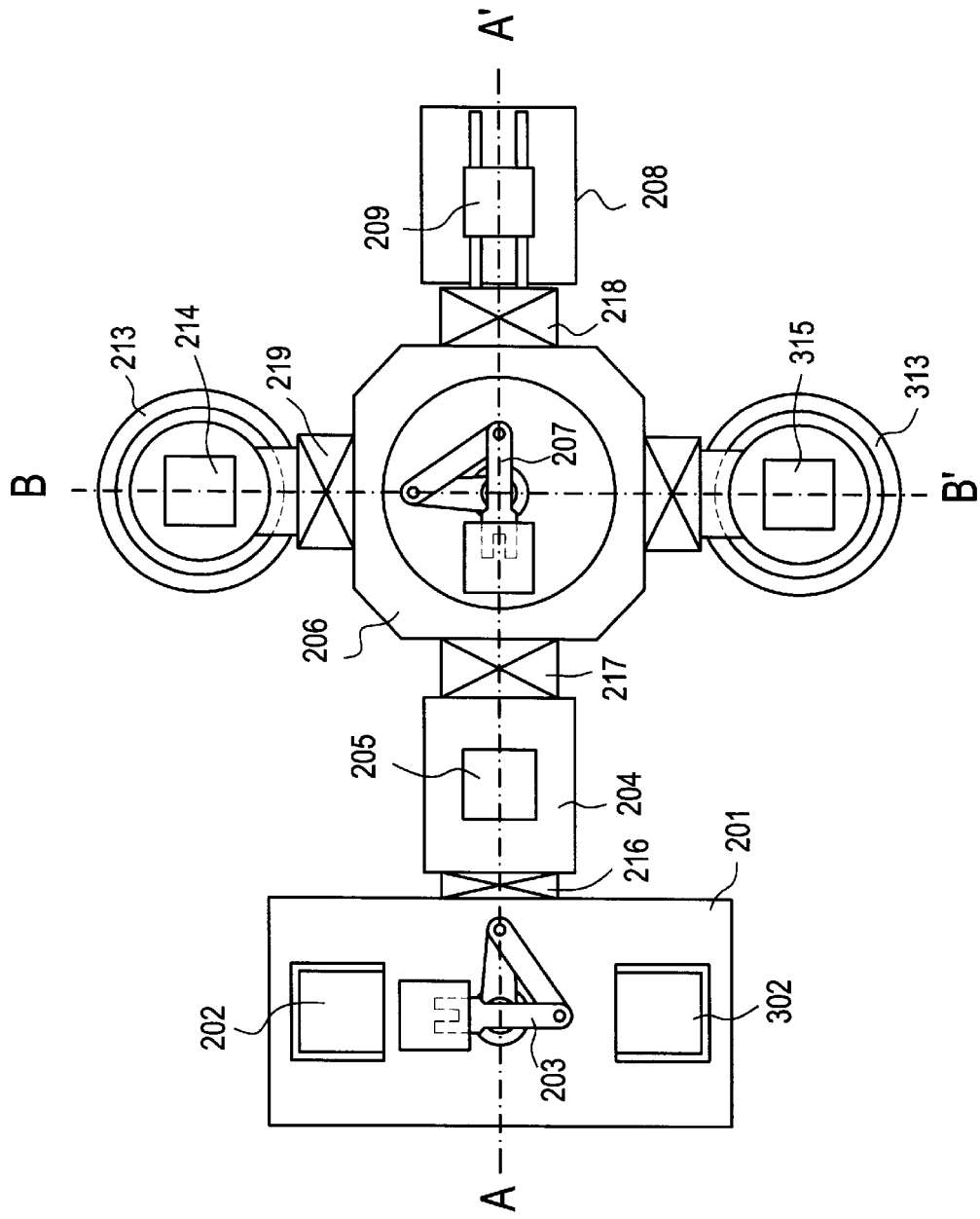
FIG. 25 is a top view of the apparatus for laser processing.
Figure 26:
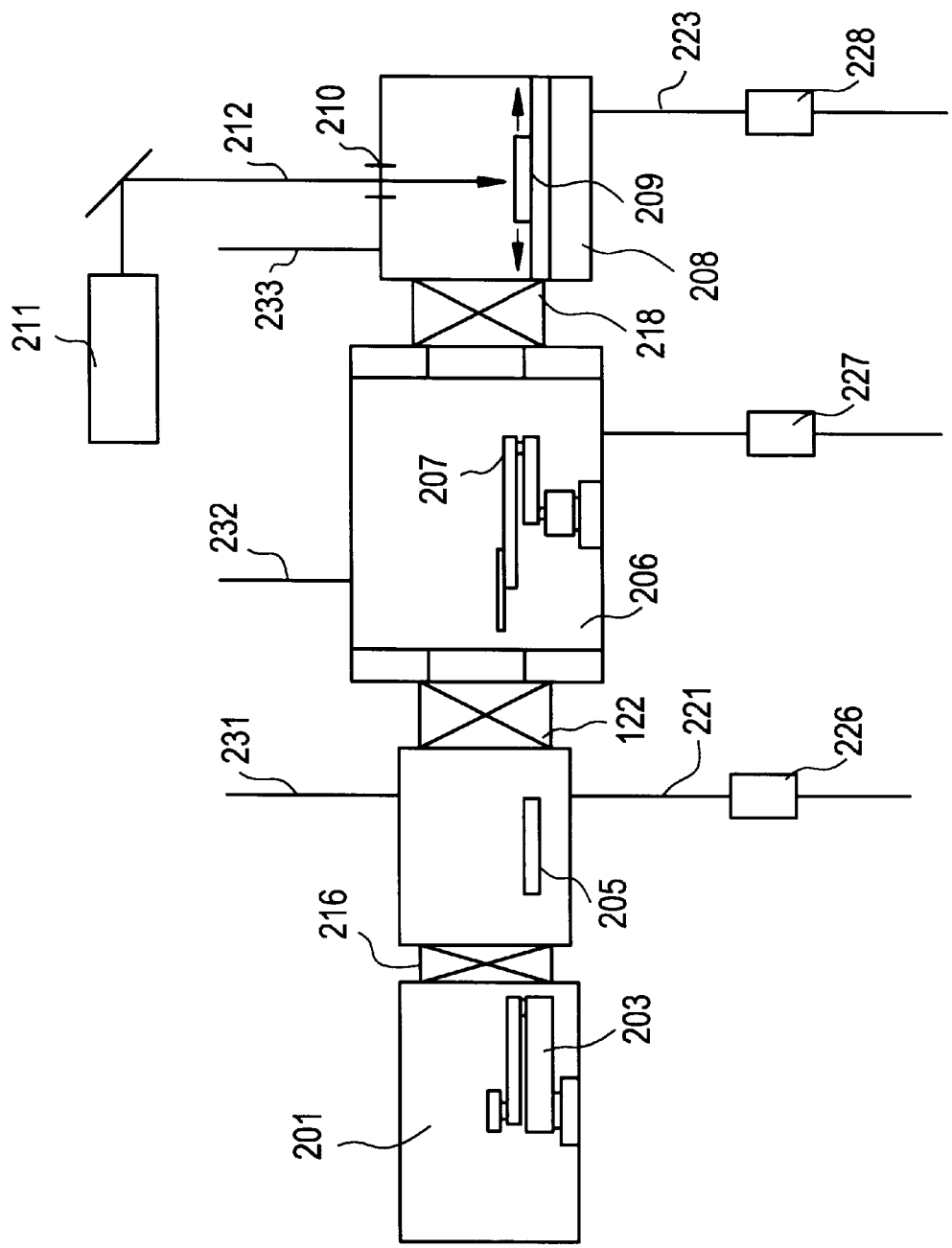
FIG. 26 is a sectional view of the apparatus for laser processing.
Figure 27:
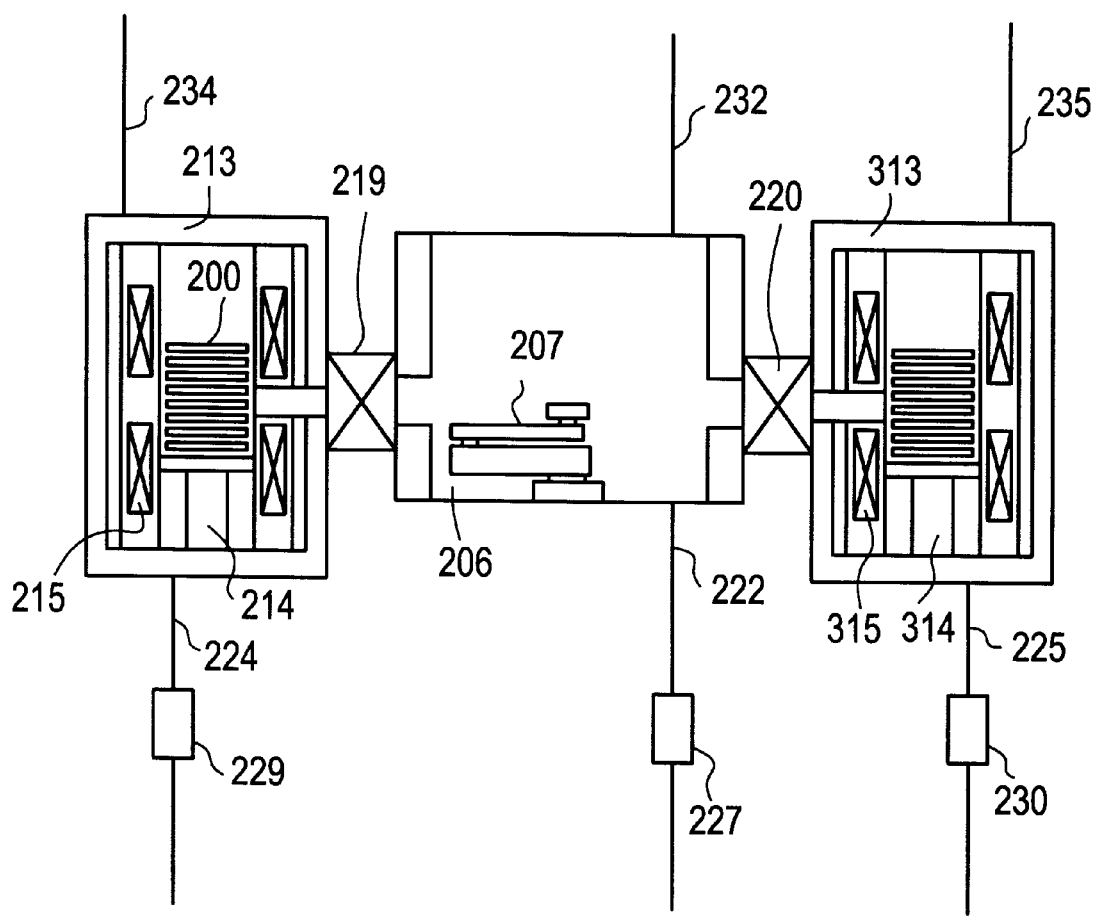
FIG. 27 is a sectional view of the apparatus for laser processing.

In embodiment 7, there is shown an apparatus for laser processing used in the practice of the invention. FIG. 25 shows a top view of the apparatus of laser processing. FIG. 26 shows a sectional view taken along line A–A' of FIG. 25. FIG. 26 shows a sectional view taken along line A–A' of FIG. 25. FIG. 27 shows a sectional view taken along line B–B' of FIG. 25.

Referring to FIGS. 25 to 27, a cassette receiving and feeding chamber 201 is a chamber for receiving and feeding a cassette 202 and 302 for accommodating a substrate, and the chamber 201 is provided with a robot arm 203.

The cassette 202 accommodates a large number of substrates on which a silicon film to be irradiated with laser light and a thin-film transistor in the fabrication step are formed. The substrates are conveyed one by one from the cassette 202 into the apparatus with the robot arm 203 to be irradiated with laser light. Lastly, the substrates that have been irradiated with laser light are accommodated in the cassette 302 with the robot arm 203.

The carry-in and conveyance chamber 204 serves as means for carrying in and conveying the substrates from the cassette receiving and feeding chamber 201. A placement base 205 for placing the substrate is provided. This placement base 205 has an alignment function to align the substrate and robot arm position precisely.

Reference numeral 206 denotes a conveyance chamber for conveying the substrate into the apparatus, and a robot arm 27 for conveying the substrate one by one is provided therein. This robot arm 207 incorporates heating means. The robot arm 207 is devised so that the temperature during the conveyance of the substrate is kept at a constant temperature (sample temperature).

Inside of the chamber 208 for laser light irradiation, a stage 209 is provided which is movable in one-dimension direction along an arrow as shown in FIG. 26. On the top surface, a synthetic quartz window 210 is provided. Incidentally, the stage 209 is provided with means for heating the substrate. The chamber 208 for laser light irradiation is constituted to irradiate the substrates with laser light 211 emitted from the external apparatus 211 for laser light irradiation via a synthetic quartz window 210.

The apparatus 211 for the laser light irradiation has a function of exciting, for example, KrF excimer laser light and incorporates an optical system shown in FIG. 5. The laser light passes through an optical system shown in FIG. 5 so that the laser light is formed into a linear beam having a width of from several millimeters to several centimeters and a length of several tens of centimeters.

Reference numeral 213 denotes a heating chamber for heating the substrate (sample). Reference numeral 313 denotes a gradual cooling chamber for gradually cooling the substrate (sample). The heating chamber 213 and the gradual cooling chamber 313 have the same structure, respective chambers being provided with a lifts 214 and 314 movable in the vertical direction, resistance heating means 215 and 315 for heating the substrate. On the lifts 214 and 314, the substrates 200 are stacked and accommodated with a predetermined space with each other. In this state, a large number of substrates 200 are heated or cooled to a predetermined temperature at the same time with the resistance heating means 215 and 315. When the substrate is carried in and transferred from the heating chamber 213, the lifts are moved up and down so that the substrates can be carried in and conveyed from the conveyance chamber 206 with the robot arm 207 in the conveyance chamber 206.

The carry-in and transfer chamber 204, the conveyance chamber 206 and the chamber for the laser light irradiation, the heating chamber 213, and the gradual cooling chamber 313 have a sealed structure respectively. The air-tightness of each chamber is further heightened by providing the gate valves 216 to 220. The carry-in chamber 204, the conveyance chamber 206, the chamber 208 for the laser light irradiation, and the heating chamber 213 are connected to the vacuum pumps 226 to 230 with exhaust systems 221 to 225, respectively. Each chamber can be formed in a reduced pressure state or in a high vacuum state. Further each chamber is provided with gas supply systems 231 to 235 for supplying required gas (for example, inert gas).

In this embodiment, the cassette 202 accommodating a large number of substrates (samples) (substrates having, for example, a state of FIG. 12(C)), and an empty cassette 302 for accommodating substrates that have been irradiated with laser light. The gate valve 216 is closed, and the carry-in and conveyance chamber 204, the conveyance chamber 206, the chamber 208 for the laser light irradiation, the heating chamber 213 and the gradual cooling chamber 216 are formed into a high vacuum state using vacuum pumps 226 to 230. After the passage of predetermined time, the gate valve 216 is opened. One substrate is taken out from the cassette 202 with the robot arm 203 and is conveyed to the carry-in and conveyance chamber 204 to be placed on the placement base 205. The gate valve 216 is closed, and the gate valve 217 is opened so that the substrate on the placement base 205 is conveyed to the conveyance chamber 206 with the robot arm 207 in the conveyance chamber 206. The gate valve 216 is closed, the gate valve 217 is opened, and the substrate on the placement base 205 is conveyed into the conveyance chamber 206 with the robot arm 207 in the conveyance chamber 206. The gate valve 217 is opened, and the substrate held in the robot arm 207 is conveyed to the heating chamber 213. At this time, the heating chamber 213 is preliminarily heated so as to heat the substrate to a predetermined temperature.

The gate valve 217 is closed, the gate valve 216 is opened, and the subsequent substrate is taken out from the cassette 202 in the cassette receiving and feeding chamber 201 and conveyed to the carry-in and conveyance chamber 204, and then the subsequent substrate is conveyed to the heating chamber 213 with the robot arm 207. All the substrates accommodated in the cassette 202 are accommodated in the heating chamber 213 by repeating the aforementioned operation predetermined number of times. Incidentally, to keep the vacuum state in chambers behind the carry-in and conveyance chamber 204, the gate valve 216 and the gate valve 217 are controlled so that the gate valves 216 and 217 are not opened at the same time. Further, the apparatus is constituted so that when all the substrates accommodated in the cassette 202 are accommodated in the heating chamber 213, the first substrate is heated to a predetermined temperature.

When the last substrate is conveyed from the cassette 202 to the heating chamber 213, the first substrate heated to a predetermined temperature is taken out to the conveyance chamber 102 with the robot arm 207, and the gate valve 219 is closed. At this time, the temperature of the substrate is kept even during the conveyance with the heating means incorporated in the robot arm 207. This heated substrate is conveyed to a chamber 208 for the laser light irradiation and is placed on the stage 209, and the gate valve 218 is closed.

The linear laser light 212 emitted from the apparatus for the laser light irradiation is incident on the chamber 208 for the laser light irradiation from a synthetic quartz window 210 so that the substrate on the stage 209 is irradiated with the laser light. A predetermined area is irradiated with laser light by moving the stage 209 in a width direction of the laser light 212. For example, in a state shown in FIG. 6(D), the substrate is irradiated with laser light by moving the substrate stage 109 from the right end of the substrate to the left end thereof so that the substrate can be scanned by the laser light.

After the completion of the laser light irradiation, the gate valve 218 is opened, the substrate on the stage 209 is conveyed to a gradual cooling chamber 313 with a robot arm 207. Then the second substrate is conveyed to the chamber 208 for the laser light irradiation so that the second substrate is irradiated with laser light. Although the temperature of this gradual cooling chamber 313 is set to a lower level than the counterpart of the heating chamber 213, it is constituted so that no drastic temperature variation is generated for fear that the substrate might be damaged.

The aforementioned operation is repeated a predetermined number of times so that all the substrates in the heating chamber 213 are irradiated with laser light followed by being successively conveyed to the gradual cooling chamber 313 to be cooled. The apparatus is constituted in such a manner that when the last substrate is conveyed to the gradual cooling chamber 313, the first substrate is cooled to an appropriate temperature. At this time, the gate valve 217 is opened, the first substrate is conveyed from the heating chamber 213 to the carry-in and conveyance chamber 204 with the robot arm 207 and is placed on the placement base 205. When the gate valve 217 is closed and the gate valve 216 is opened, the substrate on the placement base 205 is accommodated in the cassette 302 with the robot arm 203. Then, after the gate valve 216 is closed, the gate valve 217 is opened so that the second substrate is conveyed from the gradual cooling chamber 313 to the carry-in and conveyance chamber 204 with the robot arm 207. By repeating the aforementioned operation a predetermined number of times, all the substrates cooled in the gradual cooling chamber 313 are accommodated in the cassette 302. The cassette as a whole is taken out of the apparatus.

In embodiment 7, time elapsed from the carry-in of the first substrate in the heating chamber 213 up to the carry-in of the last substrate in the heating chamber 213 is set to be equal to time elapsed from the taking out the first substrate from the heating chamber 213 to start to convey the first substrate to the chamber 208 for the laser light irradiation up to the taking out the last substrate from the heating chamber to start to convey the last substrate to the chamber 208 for the laser light irradiation. In this manner, the time during which the substrates are held in the heating chamber can be set to an equal level with respect to all the substrates.

In this embodiment, the temperature can be controlled to cool the temperature by providing a gradual cooling chamber 313 according to embodiment 1 shown in FIGS. 1 to 3. Consequently, even substrates that are liable to be damaged under the influence of a rapid change in temperature can be safely cooled without any damage. Thus, the yield ratio of semiconductors can be improved. For example, the temperature of the heating chamber 213 and the stage 209 for the chamber 208 for the laser light irradiation may be set to 500° C. while the temperature of the gradual cooling chamber 313 may be set to 200° C. When the temperature of the gradual cooling chamber 313 is set to about 200° C., no rapid change in temperature is provided to the substrate even when the substrate is conveyed to the cassette receiving chamber 201 at room temperature from the gradual cooling chamber 313. In this particular embodiment, the gradual cooling chamber 313 is used as a chamber for cooling the substrate, the chamber 313 can be used also as a chamber for heating the substrate.

Further, in this embodiment, heating, laser light irradiation, and cooling are carried out at the same time in the heating chamber 213, the chamber 208 for the laser light irradiation and the gradual cooling chamber 313, respectively. Thus, the time required for the laser processing can be shortened.

In accordance with the present invention, the crystalline silicon crystallized by the introduction of the metal element promoting the crystallization and the heat treatment is annealed by the laser light irradiation while the sample is heated to a temperature ranging within the scope of ±100° C. from the temperature of the aforementioned heat treatment with the result that the crystallinity of the crystalline silicon film is further heightened to provide a silicon film having a favorable crystallinity.

Further, impurity ions are doped into the crystalline silicon film crystallized by the introduction of the metal element promoting the crystallization and heat treatment and the crystalline silicon film is annealed by the laser light irradiation while the sample is heated at a temperature within the range of ±100° C. from the temperature at the time of the aforementioned heat treatment with the result that the formation of the impurity area can be effectively carried out.

Further, the amorphous silicon film is irradiated with linear laser light from one side of the film to the other side thereof while being heated to a temperature of 450° C. or more with the result that the crystal growth can be successively carried out to form a single crystal or an area that can be regarded as the single crystal.

In particular, a single crystal or an area having a high crystallinity (an area which can be regarded almost as the single crystal) can be easily formed in a state in which a metal element promoting the crystallization is introduced into the amorphous silicon film. Further, at this time, the metal element can be deflected at the end of the crystal growth by irradiating the crystalline silicon film with linear laser light while moving the linear laser light with the result that the density of the metal element in the crystalline area can be reduced as much as possible.

Example 8

Figure 6A:
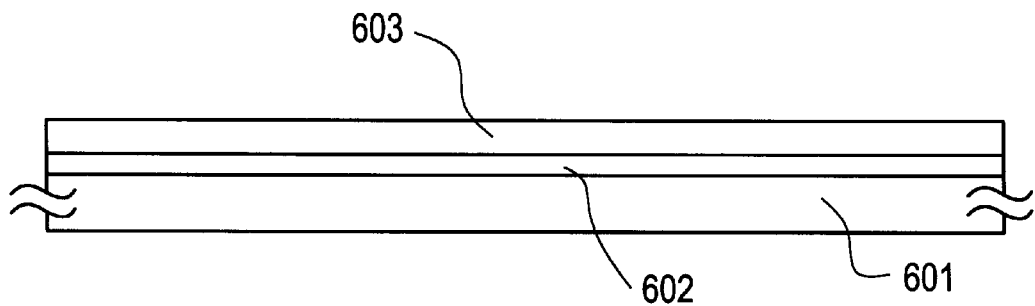
FIGS. 6(A)–6(C) are cross-sectional views illustrating steps for forming a crystalline silicon film on a substrate according to Example 2 of the invention.
Figure 6B:
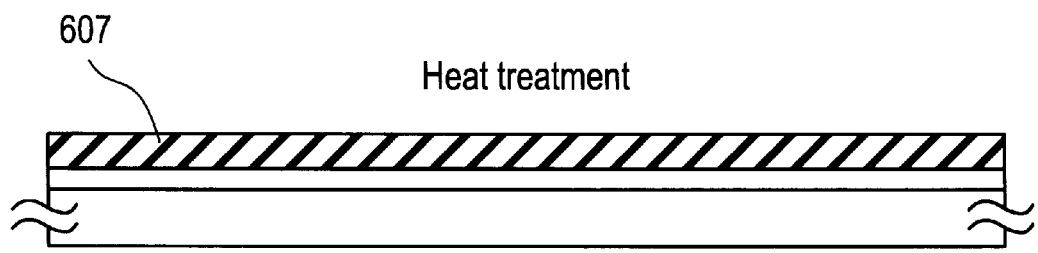
Figure 6C:
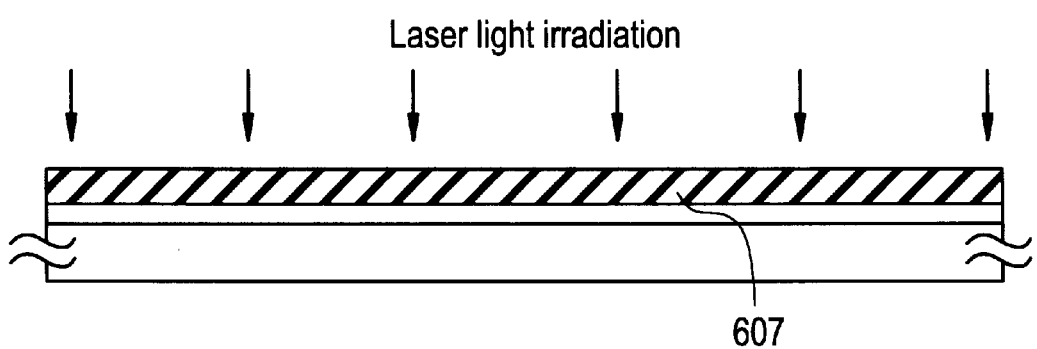

In the present example, a thin-film transistor is fabricated by a laser processing method disclosed herein. FIGS. 6(A)–6(C) illustrate steps performed until a crystalline silicon film is obtained. First, as shown in FIG. 6(A), a glass substrate 601 is prepared. A silicon oxide film 602 is formed as a buffer film on the surface of the substrate to a thickness of 3000 Å by sputtering. For example, the glass substrate can consist of Corning 7059 glass.

Then, an amorphous silicon (a-Si) film 603 is formed to a thickness of 500 Å by plasma-assisted CVD or low-pressure CVD (LPCVD) (FIG. 6(A)).

Thereafter, the laminate is heat-treated to crystallize the amorphous silicon film 603, thus obtaining a crystalline silicon film 607. At this time, the heating temperature is about 450–750° C. However, where the heat resistance of the glass substrate is taken into account, it is necessary to perform the heat treatment below 600° C. If the heating temperature is lower than 500° C., then it takes tens of hours to complete the crystallization step. This is disadvantageous to the productivity. In the present example, in view of the heat resistance of the glass substrate and also in view of the time of the heat treatment, the heat treatment is conducted at 550° C. for 4 hours. In this way, the crystalline silicon film 607 is obtained (FIG. 6(B)).

After obtaining the crystalline silicon film 607 by the heat treatment, laser light is directed to the film 607 by the use of the laser processing system shown in FIGS. 1–3 to promote crystallization of the crystalline silicon film 607. This laser processing step is briefly described below.

First, a cassette 105 holding a number of substrates (samples) assuming the state shown in FIG. 6(C) is inserted into a substrate loading/unloading chamber 101. Each chamber is evacuated to a high vacuum. It is assumed that every gate valve is closed. A gate valve 122 is opened to permit a robot arm 106 to take one substrate 100 from the cassette 105 and to transport the substrate into a conveyance chamber 102. Then, another gate valve 124 is opened. The substrate held by the robot arm 106 is moved into the heating chamber 104, which has been preheated, to heat the substrate at a desired temperature.

After transporting the substrate into the heating chamber 104, the next substrate is taken from the cassette 105 again by the robot arm 106 and moved into the heating chamber 104. These operations are repeated a given number of times. In this way, all the substrates held in the cassette 105 are received in the heating chamber 104. Then, the gate valves 122 and 124 are closed.

After a lapse of a given time, the gate valve 124 is opened. The substrate heated to the given temperature (500° C. in this example) is brought into the conveyance chamber 102 by the robot arm. During the movement of this substrate, the substrate is maintained at 500° C. by the heating means incorporated in the robot arm. Thereafter, the gate valve 124 is closed. The gate valve 123 is opened. The heated substrate is conveyed into the chamber 103 for irradiating the substrate with laser light. Then, the gate valve 123 is closed.

The laser light has a linear cross section. A substrate stage 109 is moved laterally of the cross section of the laser light so that the laser light illuminates a desired area. In this example, as shown in FIG. 6(C), the substrate stage 109 is moved in such a way that the laser light is swept from the right end of the figure to the left end during the laser irradiation. It is assumed that the stage 109 moves at a speed of 10 cm/min. In the present example, the temperature of the stage 109 is maintained at 500° C. during the laser irradiation.

After completion of the laser irradiation, the gate valve 123 is opened. The substrate held by the substrate holder is moved into the conveyance chamber 102 by the robot arm 106. Then, the gate valve 123 is closed. Thereafter, the gate valve 122 is opened. The substrate is inserted into the cassette 105 inside the loading/unloading chamber 101. Then, the gate valve 122 is closed.

The operations described above are repeated to irradiate every substrate received in the heating chamber with the laser light. After completion of these irradiation steps, the substrates received in the cassette 105 are taken from the system one by one through the substrate loading/unloading chamber 101.

The crystallinity of the crystalline silicon film is promoted by laser irradiation, as shown in FIG. 6(C). Then, the film is photolithographically patterned to form the active layer 701 of a thin-film transistor (FIG. 7(A)).

Then, a silicon oxide film 702 acting as a gate-insulating film is formed to a thickness of 1000 Å by sputtering or plasma-assisted CVD. Subsequently, an aluminum film containing 0.18% by weight of scandium is formed to a thickness of 6000 Å by evaporation techniques. The aluminum film is photolitho graphically patterned to form a gate electrode 703. Thereafter, an anodization process is carried out in an ethylene glycol solution containing 5% tartaric acid. In this process, the gate electrode 703 is used as the anode. In this way, an aluminum oxide layer 704 is formed to a thickness of about 2500 Å. This thickness of the oxide layer 704 determines the length of an offset gate region which will be formed by an impurity ion implantation step performed later.

Figure 7B:
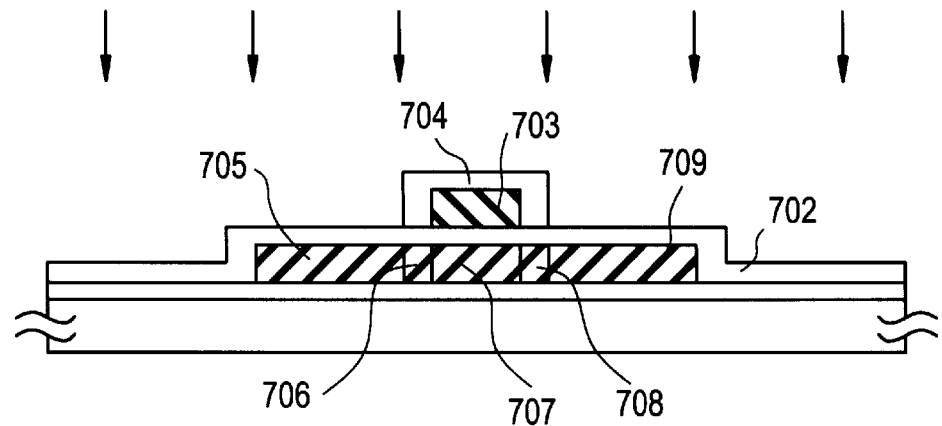

As shown in FIG. 7(B), impurity ions (phosphorus ions in this example) are introduced into the active layer by ion doping or plasma doping techniques. At this time, the gate electrode 703 and surrounding oxide layer 704 act as a mask. The impurity ions are lodged into regions 705 and 709 indicated by the hatching. In this manner, the source region 705 and the drain region 709 are formed by self-aligned techniques. A channel formation region 707 and offset gate regions 706, 708 are formed again by self-aligned techniques.

After the implantation, the laminate is irradiated with laser light to recrystallize the source region 705 and the drain region 709 and to activate the implanted impurities. Instead of the laser light, intense light may be irradiated. The laser light is made to fall on the source/drain regions by the system shown in FIGS. 1–3. During this laser irradiation, the substrate is heated at a temperature of 500° C.

Figure 7C:
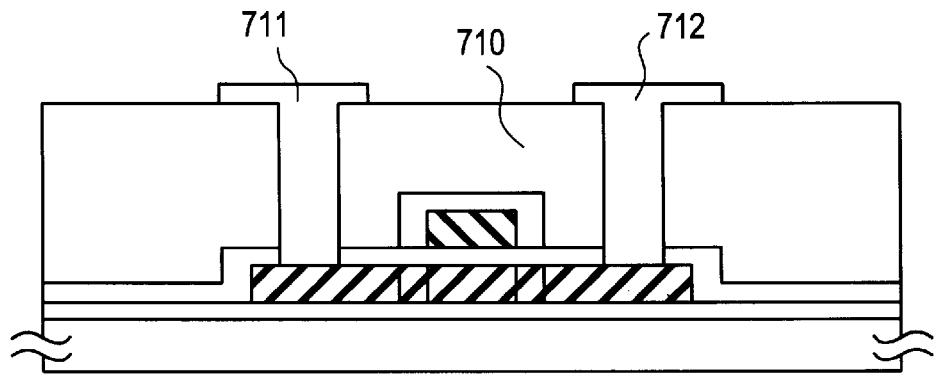

After completion of the annealing making use of laser irradiation, a silicon oxide film 710 is formed as an interlayer insulating film to a thickness of 7000 Å by plasma-assisted CVD. Then, holes are formed. A source electrode 711 and a drain electrode 712 are formed from an appropriate metal such as aluminum or from other appropriate conductive material. Finally, the laminate is heat-treated in a hydrogen ambient at 350° C. for 1 hour. In this way, a thin-film transistor as shown in FIG. 7(C) is completed.

Example 9

In the present example, an amorphous silicon film is irradiated with laser light to form either a single crystal or a region having crystallinity which can be regarded as very close to a single crystal. Using this region, the active layer of a thin-film transistor is formed.

Figure 8A:
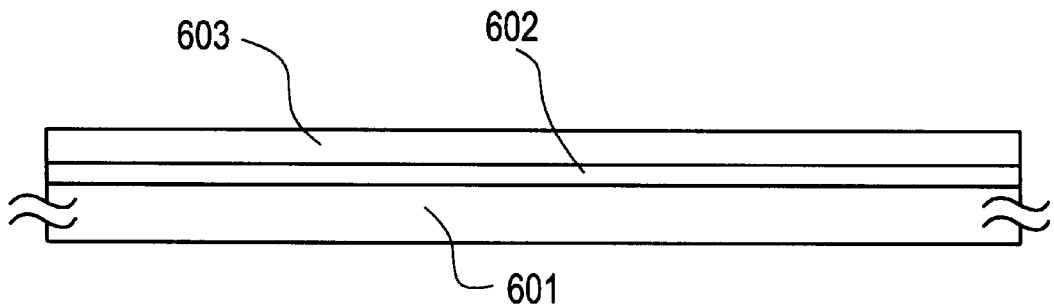
FIGS. 8(A)–8(C) are cross-sectional views illustrating steps for forming a crystalline silicon film on a substrate according to Example 3.
Figure 8B:
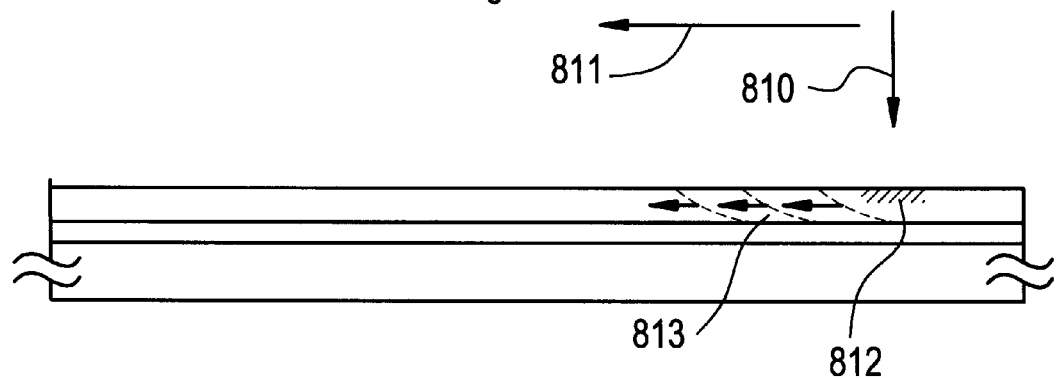
Figure 8C:
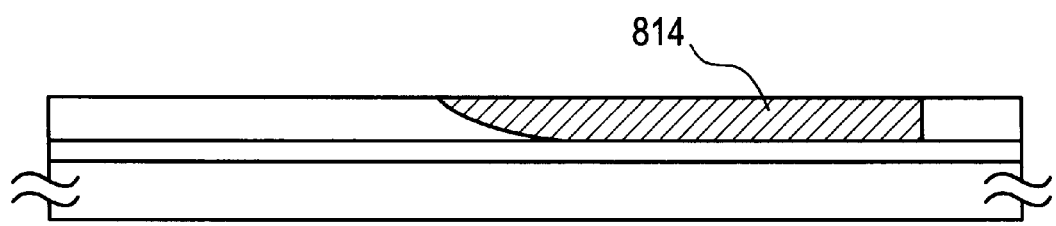

FIGS. 8(A)–8(C) illustrate steps for forming either the single crystal or the region having crystallinity which can be regarded as very close to a single crystal. First, a silicon oxide film 602 is formed as a buffer film on a glass substrate 601 to a thickness of 3000 Å by sputtering. An amorphous silicon film 603 is then formed to a thickness of 5000 Å by plasma-assisted CVD or LPCVD (FIG. 8(A)).

Laser light is irradiated by the use of the system shown in FIGS. 1–3. During this laser irradiation, the sample is heated at a temperature of 500° C. The laser light 810 has a linear cross section. The longitudinal direction of this linear cross section is in the direction of the depth of the drawing. Crystal nuclei are formed in a region 812 or this region 812 is crystallized by heating.

The laser light 810 is swept in the direction indicated by the arrow 811 at a quite low speed of 1 mm to 10 cm/min. As the linear cross-sectional laser light 810 is moved in the direction indicated by the arrow 811, crystals are grown as indicated by 813 from the region 812. In this process, crystals are grown epitaxially or substantially epitaxially from the crystal nuclei or from the region 812 where crystals are formed (FIG. 8(B)).

This crystallization takes place as follows. The region irradiated with the laser light is molten. Crystals are grown epitaxially or substantially epitaxially from the previously crystallized region toward the molten region. As the linear laser light 810 is swept as indicated by 811, the crystal growth progresses as indicated by 813 (FIG. 8(C)).

The laser irradiation step is described in detail below. First, a cassette 105 holding a number of substrates (samples) assuming the state shown in FIG. 8(A) is inserted into a substrate loading/unloading chamber 101. Each chamber is evacuated to a high vacuum. It is assumed that every gate valve is closed. A gate valve 122 is opened to permit a robot arm 106 to take one substrate 100 from the cassette 105 and to transport the substrate into a conveyance chamber 102. Then, another gate valve 124 is opened. The substrate held by the robot arm 106 is moved into the heating chamber 104, which has been preheated (at 500° C.), to heat the substrate at a desired temperature.

After transporting the substrate into the heating chamber 104, the next substrate is taken from the cassette 105 again by the robot arm 106 and moved into the heating chamber 104. These operations are repeated a given number of times. In this way, all the substrates held in the cassette 105 are received in the heating chamber 104.

After a lapse of a given time, the gate valve 124 is opened. The substrate heated at the given temperature (500° C. in this example) is brought into the conveyance chamber 102 by the robot arm 106. During the movement of this substrate, the substrate is maintained at 500° C. by the heating means incorporated in the robot arm. Thereafter, the gate valve 124 is closed. The gate valve 123 is opened. The heated substrate is conveyed into the chamber 103 for irradiating the substrate with laser light. Then, the gate valve 123 is closed.

The laser light has a linear cross section. A substrate stage 109 is moved laterally of the cross section of the laser light so that the laser light illuminates a desired area. In this example, as shown in FIG. 8(B), the substrate stage 109 is moved in such a way that the laser light is swept from the right end of the drawing to the left end during the laser irradiation. It is assumed that the stage 109 moves at a speed of 1 cm/min. In the present example, the temperature of the stage 109 is maintained at 500° C. during the laser irradiation.

After completion of the laser irradiation, the gate valve 123 is opened. The substrate held by the substrate holder is moved into the conveyance chamber 102 by the robot arm 106. Then, the gate valve 123 is closed. Thereafter, the gate valve 122 is opened. The substrate is inserted into the cassette 105 inside the loading/unloading chamber 101. Then, the gate valve 122 is closed.

The operations described above are repeated to irradiate every substrate received in the heating chamber with the laser light. After completion of these irradiation steps, the substrates received in the cassette 105 are taken from the system one by one through the substrate loading/unloading chamber 101.

In the present example, the time between the instant when the first substrate is transported into the heating chamber 104 and the instant when the final substrate is carried into the heating chamber 104 is set equal to the time between the instant when the first substrate is taken from the heating chamber 104 and started to be moved toward the laser irradiation chamber 103 and the instant when the final substrate is taken from the heating chamber 104 and started to be transported toward the laser irradiation chamber 103. As a result, every substrate is held in the heating chamber for the same time.

The amorphous silicon film is formed on each substrate. At the temperature of 500° C., crystal nuclei are easily formed in a short time and crystallization progresses. Therefore, making uniform the times for which the substrate are respectively held in the heating chamber 104 is important for fabrication of uniform crystalline silicon films.

In this way, a region 814 which consists of a single crystal or can be regarded as a single crystal can be obtained as shown in FIG. 8(C). This region 814 contains hydrogen atoms at a concentration of $10^{16}$ to $10^{20}$ cm$^{-3}$. The internal defects are terminated by hydrogen atoms. This region can be regarded as a very large crystal grain. This region can be further increased in size.

Figure 9A:
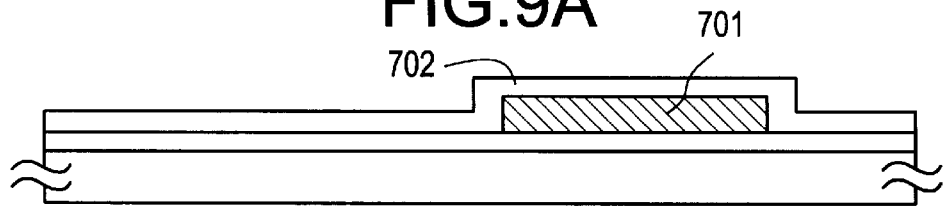
FIGS. 9(A)–9(D) are cross-sectional views illustrating steps for forming a thin-film transistor according to Example 3.

When the region 814 which consists of a single crystal or can be regarded as a single crystal is obtained as shown in FIG. 8(C), the active region of a thin-film transistor is formed, using this region. That is, a patterning step is conducted to form the active region, indicated by 701 in FIG. 9(A). During this patterning step, extremely thin oxide film 802 is removed. A silicon oxide film 702 serving as a gate-insulating film is formed to a thickness of 1000 Å by sputtering or plasma-assisted CVD (FIG. 9(A)).

Figure 9B:
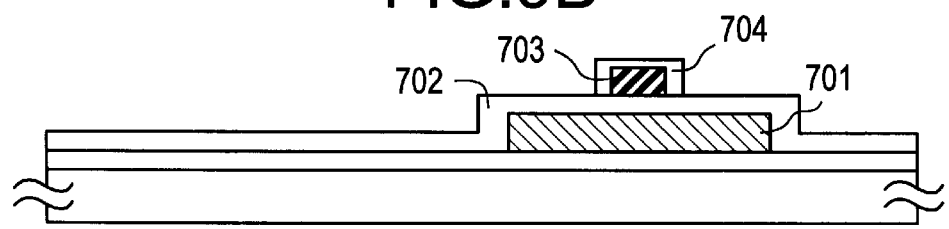

Subsequently, an aluminum film containing 0.18% by weight of scandium is formed to a thickness of 600Å by electron-beam evaporation techniques. The aluminum film is photolitho graphically patterned to form a gate electrode 703. Thereafter, an anodization process is carried out in an ethylene glycol solution containing 5% tartaric acid. In this process, the gate electrode 703 is used as the anode. In this way, an aluminum oxide layer 704 is formed to a thickness of about 2500 Å. This thickness of the oxide layer 704 determines the length of an offset gate region which will be formed by an impurity ion implantation step performed later (FIG. 9(B)).

Figure 9C:
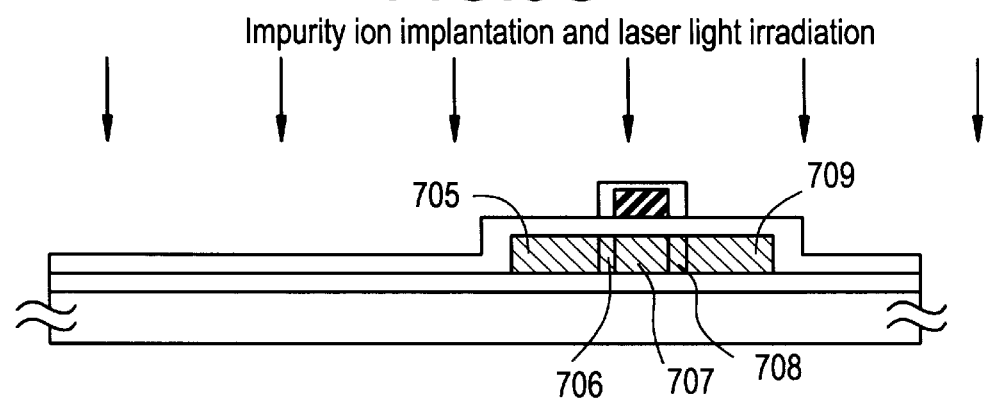

Impurity ions (phosphorus ions in this example) are introduced into the active layer by ion doping or plasma doping techniques. At this time, the gate electrode 703 and surrounding oxide layer 704 act as a mask. The impurity ions are lodged into regions 705 and 709. In this manner, the source region 705 and the drain region 709 are formed by self-aligned techniques. A channel formation region 707 and offset gate regions 706, 708 are formed again by self-aligned techniques (FIG. 9(C)).

The laminate is irradiated with laser light through the use of the laser processing system shown in FIGS. 1–3 to recrystallize the source region 705 and the drain region 709 and to activate the implanted impurities.

Figure 9D:
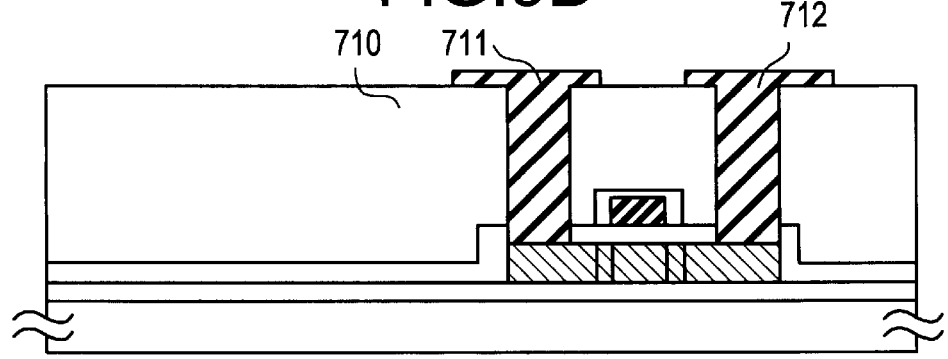

After completion of the annealing making use of laser irradiation, a silicon oxide film 710 is formed as an interlayer insulating film to a thickness of 7000 Å by plasma-assisted CVD. Then, holes are formed. A source electrode 711 and a drain electrode 712 are formed from an appropriate metal such as aluminum or from other appropriate conductive material. Finally, the laminate is heat-treated in a hydrogen ambient at 350° C. for 1 hour. In this way, a thin-film transistor as shown in FIG. 9(D) is completed.

The thin-film transistor in the present example has the active layer formed, using the region which consists of a single crystal or can be regarded as a single crystal. Therefore, substantially no crystal grains exist in the active region. The operation of the thin-film transistor can be prevented from being affected by the crystal grain boundaries.

The configuration of the present example can be effectively used where a plurality of thin-film transistors arranged in a row are formed. For example, the configuration can be utilized where a number of thin-film transistors are arranged in a row in the direction of the depth of the drawing as shown in FIG. 9(D). This configuration consisting of a row of thin-film transistors can be used in a peripheral circuit such as a shift register circuit for a liquid crystal display. These thin-film transistors using such a crystalline silicon film which consists of a single crystal or can be regarded as a single crystal can be conveniently used in an analog buffer amplifier or the like.

Example 10

In the present example, a crystalline silicon film which is closer to a single crystal (has better crystallinity) can be efficiently obtained by skillfully making use of the mechanism of the crystallization induced by laser irradiation.

Figure 10A:
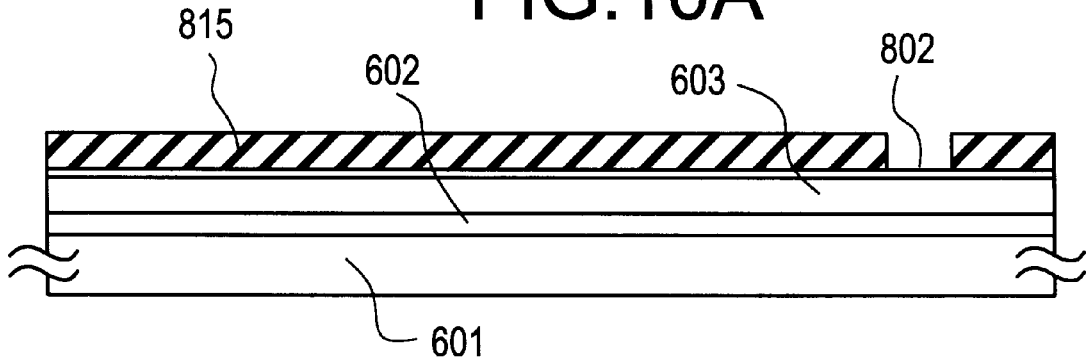
FIGS. 10(A)–10(C) are cross-sectional views illustrating steps for forming a crystalline silicon film on a substrate according to Example 4 of the invention.
Figure 10B:
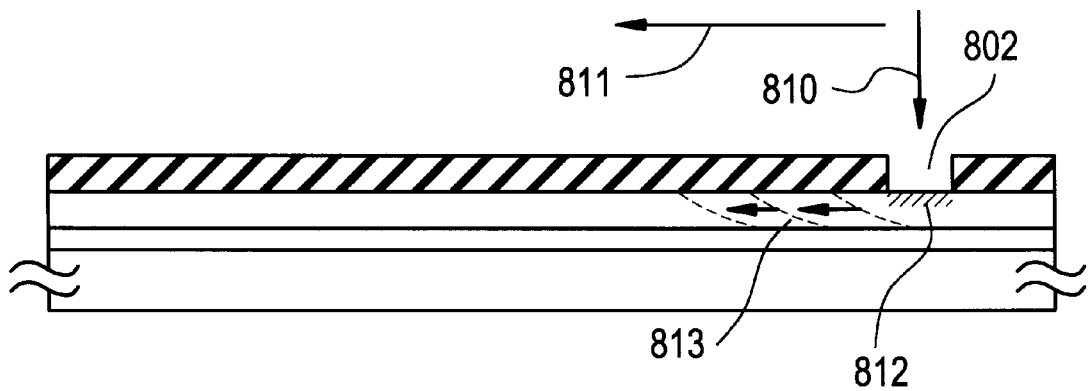
Figure 10C:
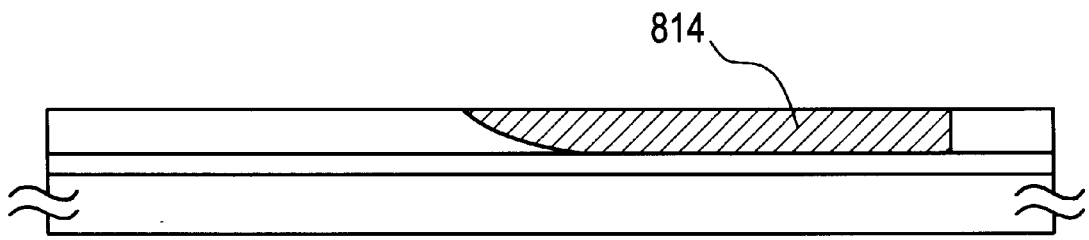

FIGS. 10(A)–10(C) illustrate fabrication steps in the present example. First, a silicon oxide film 602 is formed as a buffer layer on a glass substrate 601 to a thickness of 3000 Å by sputtering techniques. Then, an amorphous silicon film 603 is formed to a thickness of 500 Å by plasma-assisted CVD or low pressure thermal CVD. Subsequently, a mask is formed from a silicon oxide film. This silicon oxide film may be formed by sputtering or plasma-assisted CVD. Also, the silicon oxide film may be formed, using a liquid which is applied to form a silicon oxide film. This liquid in the form of a solution solidifies when heated to about 100–300° C. For example, OCD (Ohka diffusion source) solution prepared by Tokyo ohka Kogyo Co., Ltd. can be used. This silicon oxide film 815 has a slit in a region indicated by 802, the slit extending in the direction of the depth of the drawing. A part of the surface of the amorphous silicon film 603 is exposed by the slit-like region 802. This slit-like region has a desired length and a width of several micrometers to tens of micrometers (FIG. 10(A)).

During the irradiation, the linear laser light is swept in the direction indicated by the arrow 811, as shown in FIG. 10(B). The cross section of this laser light is shaped into a form extending in the direction of depth of the drawing by the optics shown in FIG. 5.

When the laser light 810 is being emitted, the sample is heated at 500° C. The laser light is swept at a very low speed of approximately 1 mm to 10 cm/min. At this time, crystal nuclei or a crystallized region is formed by heating in the region 812 indicated by the hatching.

During the laser irradiation, if the linear laser light is moved in the direction indicated by the arrow 811, the region 812 is rapidly cooled after the irradiation because no silicon oxide film exists on the surface of the region 812. The amorphous silicon film swept by the laser light is sandwiched between the upper and lower silicon oxide films. Therefore, heat can escape to nowhere. Hence, the film is momentarily heated to a high temperature. In particular, a cool region 812 having crystalline structure coexists with a hot molten region. Of course, a steep temperature gradient exists between them. This temperature gradient promotes crystal growth. As a result, crystal growth which can be regarded as epitaxial growth progresses as indicated by 813. In consequence, a region 814 which consists of a single crystal or can be regarded as a single crystal can be obtained.

In the configuration of the present example, start of growth at the growth starting point can be facilitated. Consequently, a region which consists of a single crystal or can be regarded as a single crystal can be formed in a part of the film.

In this way, a region 814 which consists of a single crystal or can be regarded as a single crystal as shown in FIG. 10(C) can be obtained. This region 814 can be made to have a length of tens of micrometers or more. A single-crystal thin-film transistor can be fabricated, using this region.

Example 11

In the present example, a thin-film transistor is fabricated, using the laser processing method disclosed herein. FIGS. 12(A)–12(D) illustrate manufacturing steps performed until a crystalline silicon film is obtained. First, as shown in FIG. 12(A), a glass substrate 601 is prepared. A silicon oxide film 602 is formed as a buffer film on the surface of the substrate to a thickness of 3000 Å by sputtering. For example, the glass substrate is made of Corning 7059 glass. Then, an amorphous silicon (a-Si) film 603 is formed to a thickness of 500 Å by plasma-assisted CVD or LPCVD. The laminate is irradiated with UV light in an oxidizing ambient to form an extremely thin oxide film 604. This oxide film 604 improves the wettability of a liquid solution in a solution application step which will be carried out later. The thickness of this oxide film 604 is on the order of tens of angstroms (FIG. 12(A)).

Thereafter, nickel (Ni) which is a metal element for promoting crystallization of the amorphous silicon film 603 is introduced. In this example, nickel element is introduced to the surface of the amorphous silicon film 603, using solution of nickel acetate. More specifically, the solution of nickel acetate adjusted so as to obtain a desired nickel concentration is dripped to form a water film 800. Then, a spin-drying step is performed, using a spinner 606. The nickel element is in contact with the surface of the amorphous silicon film. The amount of the introduced nickel is controlled by adjusting the concentration of nickel element in the nickel acetate solution (FIG. 12(B)).

Subsequently, the laminate is heat-treated to crystallize the amorphous silicon film 603. In this way, a crystalline silicon film 607 is obtained. At this time, the heating temperature is about 450–750° C. However, where the heat resistance of the glass substrate is taken into account, it is necessary to perform the heat treatment below 600° C. If the heating temperature is lower than 500 ° C., then it takes tens of hours to perform the crystallization step. This is disadvantageous to the productivity. In the present example, in view of the heat resistance of the glass substrate and also in view of the time of the heat treatment, the heat treatment is conducted at 550° C. for 4 hours. In this way, the crystalline silicon film 607 is obtained (FIG. 12(C)).

Then, the crystalline silicon film 607 is irradiated with laser light by the use of the laser processing system shown in FIGS. 1–3. This further promotes the crystallization of the crystalline silicon film 607. The laser processing steps are carried out in the same way as in Example 2.

As shown in FIG. 12(D), the crystallinity of the crystalline silicon film is promoted by laser irradiation. A patterning step is performed in the same manner as in Example 8 already described in connection with FIGS. 7(A)–7(C). Thus, the active layer of a thin-film transistor is formed. At this time, the extremely thin film 604 is removed. Using this active layer, the thin-film transistor is completed.

Example 12

Figure 18:
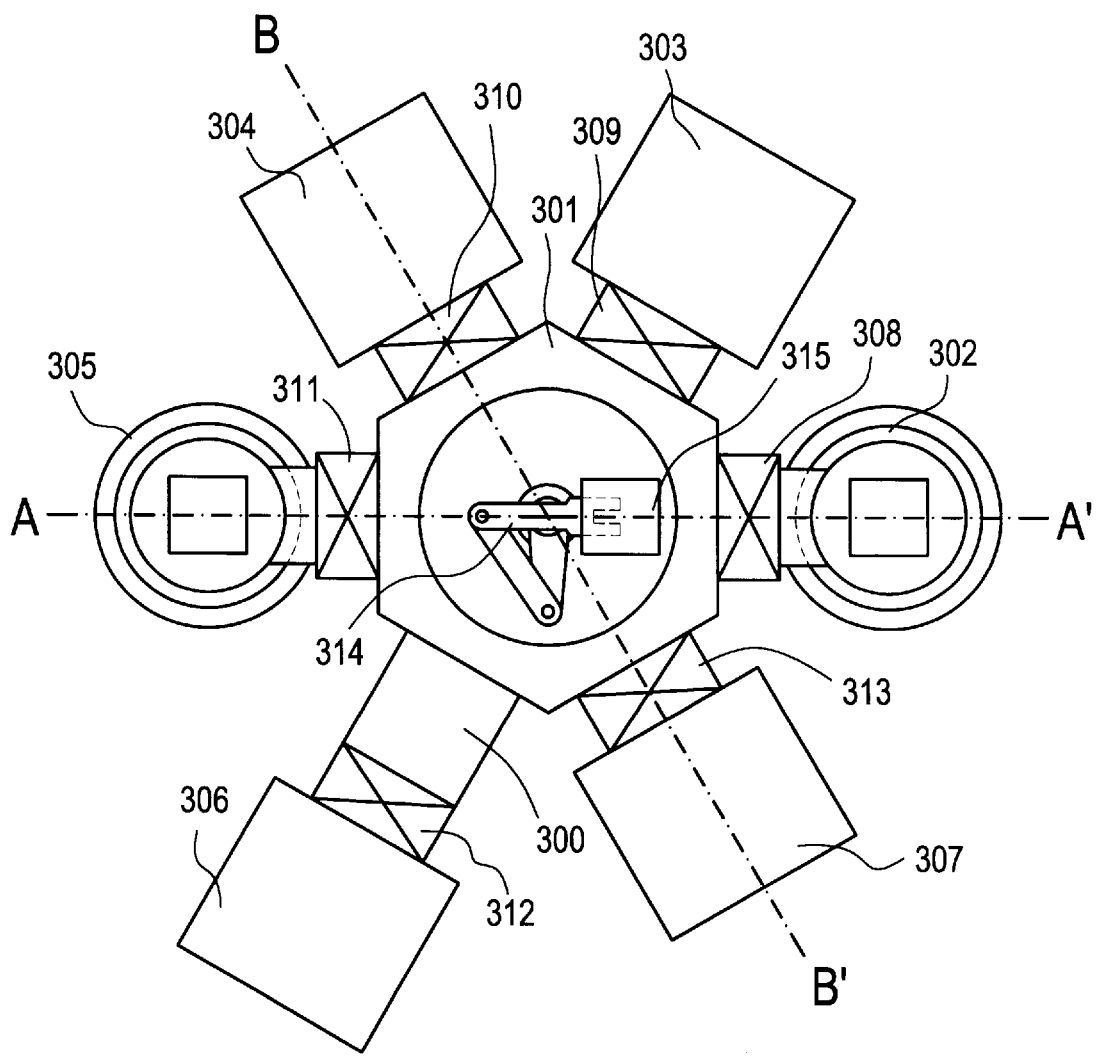
FIG. 18 is a top view of a laser processing system of Example 10 of the invention.
Figure 19:
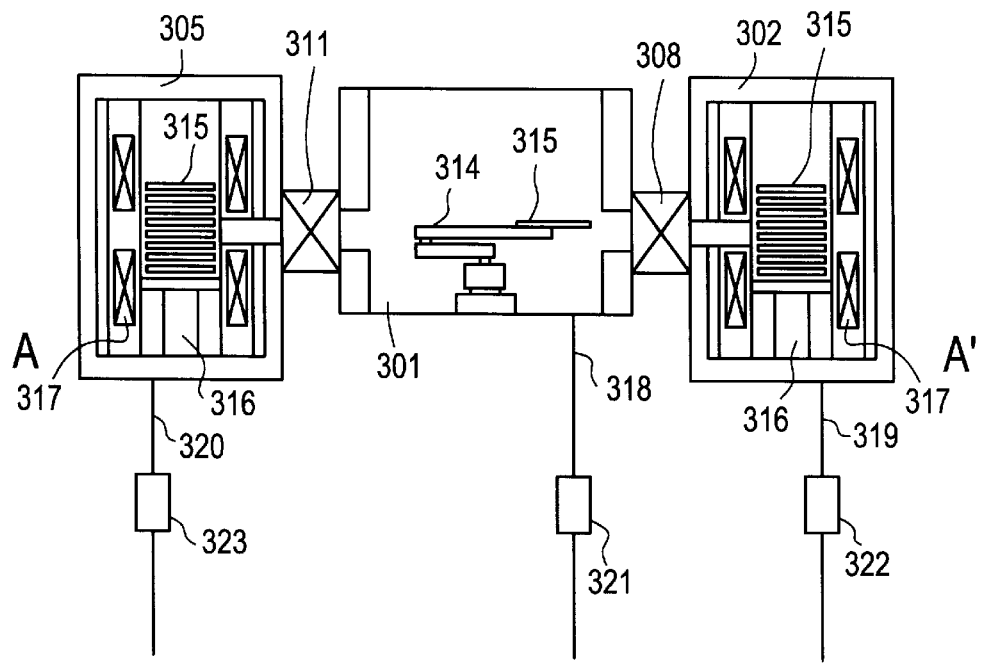
FIG. 19 is a cross-sectional view of the laser processing system of Example 10.
Figure 20:
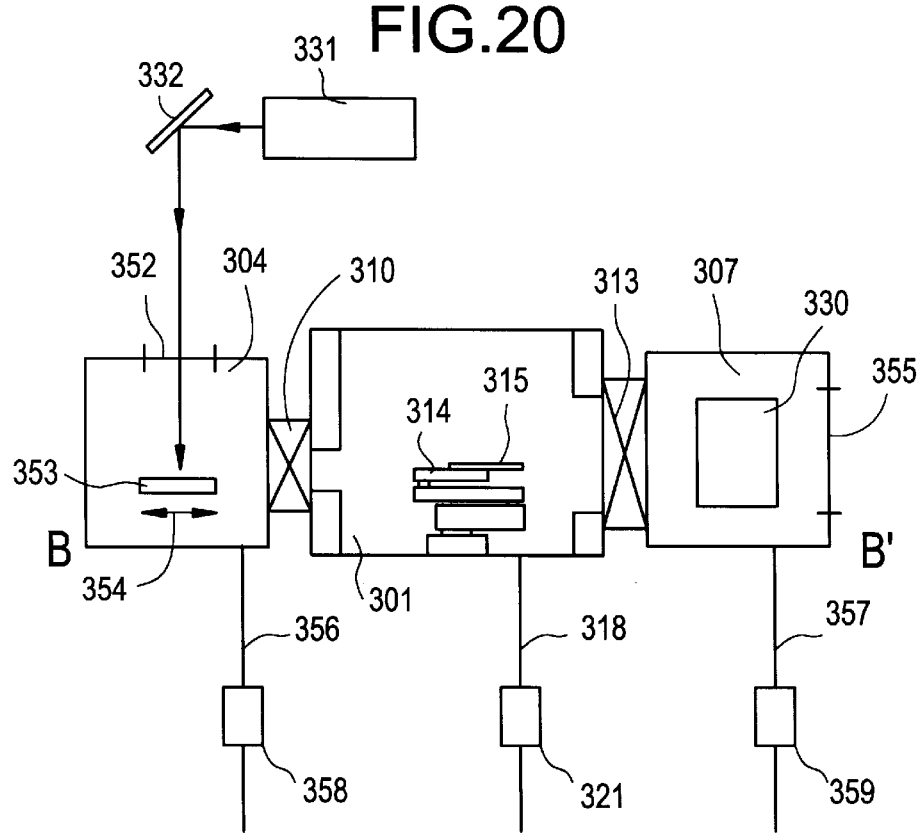
FIG. 20 is a cross-sectional view of the laser processing system of Example 10.

The present example relates to a laser processing system used to execute the present invention. FIG. 18 is a top view of the laser processing system of the present example. FIG. 19 is a cross-sectional view taken on line A–A' of FIG. 18. FIG. 20 is a cross-sectional view taken on line B–B' of FIG. 18.

In FIGS. 18–20, indicated by reference numeral 306 is a loading chamber for loading substrates (samples). The numerous substrates (samples) on which silicon films to be irradiated with laser light or unfinished thin-film transistors are formed are received in a cassette 330. Under this condition, the cassette 330 is inserted from the outside. When substrates are inserted into the substrate loading chamber 306 from the outside or they are withdrawn from the loading chamber, the substrates are moved together with the cassette holding them.

The substrates are moved inside the system by a conveyance chamber 301. This chamber is equipped with a robot arm 314 for transporting the substrates 315 one by one. The front end of the robot arm on which one substrate is placed can be rotated through 360 degrees and moved up and down. This robot arm 314 also incorporates a heating means to maintain the substrate temperature (sample temperature) constant during conveyance of the substrate 315.

A substrate positioning alignment means 300 acts to precisely align the robot arm with the substrate. That is, the alignment means 300 maintains constant the positional relation between the robot arm and the substrate.

A laser irradiating chamber 304 irradiates the substrate with laser light. In this chamber 304, laser light emitted by a laser 331 is reflected by a mirror 332 and directed to the substrate via a window 352 made of synthesized quartz, the substrate being placed on a stage 353. This stage 353 is equipped with a means for heating the substrate and capable of moving in one direction as indicated by the arrow 354.

The laser 331 can be a KrF excimer laser and is equipped with optics for shaping the cross section of the produced laser beam into a linear form as shown in FIG. 5. This linear cross section has a width of several millimeters to several centimeters and a length of tens of centimeters. The laser light is directed to the substrate (sample).

The longitudinal direction of this linear cross section of the laser light is perpendicular to the direction of movement indicated by 354. That is, the longitudinal direction extends from the front side of the sheet of FIG. 20 to the rear side. The substrate is moved along with the stage 353 in the direction indicated by 354 while irradiating the substrate with this linear laser light. In this way, the whole substrate is scanned with the laser light.

Heating chambers 302 and 305 act to heat the substrate. The heating chamber 305 heats the substrate (sample) before the laser light is made to impinge on the substrate in the laser processing chamber 304. The heating chamber 302 heat-treats the substrate after irradiated with the laser light inside the laser processing chamber 304. A large number of substrates 315 are stacked and received in each of the heating chambers 302 and 305, as shown in FIG. 19. The held substrates 315 are heated at a desired temperature by heating means (resistive heating means) 317. The substrates 315 are received over a lift 316. As the need arises, the lift 316 is moved up and down. Required ones of the substrates can be moved into and out of the heating chamber 305 one by one by means of a robot arm 314 inside a conveyance chamber 301.

A rotating chamber 303 acts to rotate each substrate through 90 degrees. A rotatable stage is installed in this rotating chamber 303. The desired substrate is carried onto this stage by the robot arm 314, and then this stage is rotated through 90 degrees. Thereafter, the substrate is taken out by the robot arm. In this way, the substrate is held by the robot arm while the substrate has been rotated through 90 degrees.

The substrate is irradiated with the laser light uniformly by the action of the rotating chamber 303. As mentioned previously, the laser beam impinging on the substrate (sample) has a linear cross section. The substrate can be totally irradiated with the laser light by moving the substrate in one direction during the irradiation. In this case, the laser light is scanned from one side of the substrate toward the opposite side. Then, the substrate is rotated through 90 degrees. Subsequently, the substrate is irradiated with the laser light similarly. It follows that the laser light is scanned in two mutually perpendicular directions. Consequently, the substrate can be irradiated with the laser light uniformly.

An unloading chamber 307 acts to bring processed substrates out of the system, and has a cassette 330 holding the substrates in the same way as in the loading chamber 306. The numerous substrates are taken out of the system along with the cassette through a door 355.

The chambers 301, 302, 303, 304, 305, 306, and 307 described above are closed vacuum vessels withstanding low pressures. These chambers have their respective evacuating systems. All of these chambers can assume reduced pressure condition. Each chamber has a system for supplying a required gas such as nitrogen gas. Also, each chamber has an evacuating system. If necessary, each chamber can be evacuated to a reduced pressure or a high vacuum. In FIG. 19, evacuating systems 318–319 are shown. In FIG. 20, evacuating systems 356, 318, and 357 are shown. These evacuating systems are shown to have high-vacuum pumps 321–323, 358, and 359.

These chambers are equipped with gate valves 310–313, 308, and 309 to assure the isolation and airtightness of each individual chamber.

An example of operation of the system shown in FIGS. 18–20 is described below. An amorphous silicon film is formed on a glass substrate (10 cm square) made of Corning 7059 glass and having a strain point of 593° C. This amorphous silicon film is irradiated with laser light to crystallize it. In this example, the amorphous silicon film is crystallized by laser irradiation. The following sequence of operation can be employed where the crystallized silicon film is further irradiated with laser light or where a silicon film doped with impurity ions is annealed during formation of source/drain regions.

In the operations described below, it is assumed that the ambient in each chamber shown in FIG. 18 is 1 atm. nitrogen ambient. In this example, a nitrogen ambient is exploited. Contamination level can be most effectively reduced to a minimum by making each chamber have a reduced pressure.

First, the gate valves 308–3 13 and the door 355 permitting access to the outside are all closed. A required number of glass substrates each having an amorphous silicon film formed thereon (hereinafter referred simply to as the substrates) are inserted into a cassette (not shown). The cassette is carried into the loading chamber 306 together with the substrates. Then, the door (not shown) of the loading chamber is closed. Subsequently, the gate valve 312 is opened. One of the substrates held in the cassette inside the loading chamber 306 is brought into the loading chamber 301 by the robot arm 314. At this time, the positional relation between the robot arm 314 and the substrate 315 is adjusted by the alignment means 300.

The substrate 315 brought into the conveyance chamber 301 is received into the heating chamber 305 by the robot arm 314. In order to put the substrate 315 into the heating chamber 305, the gate valve 311 is first opened. Then, the substrate 315 is brought into the heating chamber 305 by the robot arm 314. Subsequently, the gate valve 311 is closed.

In the heating chamber 305, the substrate is heated at a temperature of 550° C. It is important that this temperature be set lower than the strain point of the glass substrate, because if the heat treatment is performed above the strain point, then shrinkage and deformation of the glass substrate will not be neglected.

After heating the substrate for a given time in the heating chamber 305, the substrate is transported into the conveyance chamber 301 by the robot arm 314. If the gate valves 308–313 are open, they must be closed when the substrate is carried by the robot arm in order to maintain the airtightness and cleanliness of each chamber.

The substrate taken from the heating chamber 305 is moved into the laser processing chamber 304. The amorphous silicon film formed on the surface of the substrate is irradiated with laser light. The robot arm is provided with a heating means to permit the substrate to be transported from the heating chamber 305 to the laser processing chamber 304 while maintaining the substrate at a temperature of 550° C. In the laser processing chamber 304, a heating means is mounted in the stage 353 on which the substrate is placed. During the laser irradiation, the substrate is kept at a temperature of 550° C.

The laser 331 produces a laser beam of a linear cross section. This laser beam is reflected by the mirror 332 and directed to the substrate through a quartz window 352 formed in the laser processing chamber 304.

In this example, the stage 353 is moved in the direction indicated by the arrow 354 so that the desired surface (i.e., the amorphous silicon film formed on the glass substrate) is totally irradiated with the laser light. That is, the cross section of the laser beam extends from the front side of the plane of FIG. 20 toward the opposite side. The laser beam is scanned relative to the substrate in the direction indicated by the arrow 354. In this way, the whole substrate surface placed on the stage 353 is scanned with the laser light.

For example, KrF excimer laser light having a wavelength of 248 nm can be used as the above-described laser light. Also, an XeCl excimer laser, other excimer laser, or other means emitting coherent light can be used as the laser 331. Furthermore, instead of laser light, a means for emitting intense light such as infrared light may be utilized.

After completion of the laser irradiation, the substrate is once brought from the laser processing chamber 304 into the conveyance chamber 301 by the robot arm 314. At this time, the gate valve 310 is first opened. Then, the substrate is brought into the conveyance chamber by the robot arm 314. Thereafter, the gate valve 310 is closed.

The substrate put in the conveyance chamber 301 is carried into the substrate rotating chamber 303, where the substrate is rotated through 90 degrees. Any other operation is not done inside the rotating chamber 303 and so the gate valve 309 can be kept open.

After rotating the substrate through 90 degrees in the substrate rotating chamber 303, the substrate is brought into the conveyance chamber 301 again by the robot arm 314. Again, the substrate is moved into the laser processing chamber 304. At this time, the orientation of the substrate placed on the stage 303 differs by an angle of 90 degrees from the orientation of the substrate assumed when the substrate is first transported into the laser processing chamber 304.

The laser light of the linear cross section is directed to the substrate while moving the stage 353 again in the direction indicated by the arrow 354. In this case, the direction of the scan of the laser light is different from the direction of the first scan by 90 degrees. Consequently, the substrate can be uniformly irradiated with the laser light. Hence, a uniformly crystallized silicon film can be obtained on the glass substrate.

After the end of the second laser irradiation, the substrate is again taken from the conveyance chamber 301 by the robot arm 314. Then, the substrate is conveyed into the heating chamber 302, where a heat treatment conducted at 550° C. produces desirable results.

After the substrate is heat-treated in the heating chamber 302, the substrate is brought into the conveyance chamber 301 by the robot arm 314. Then, the substrate is received in the cassette 330 inside the unloading chamber 307. The operations described thus far are successively conducted to accommodate substrates into the cassette 330 inside the unloading chamber 307 in succession. When the cassette 330 is filled up, the door 355 is opened. The substrates are taken out of the system together with the cassette 330. Thus, a series of laser irradiation steps is ended.

In the present example, two heating chambers are provided. In other examples such as Examples 3 and 8–11, laser annealing is performed during fabrication of a crystalline silicon film. Then, the film is heat-treated to reduce the defect density in the silicon film. In the present example, these steps can be performed with one system because of the presence of the two heating chambers. Consequently, crystalline silicon films having high crystallinity and low defect density can be obtained with high productivity.

Especially, a silicon film of better crystallinity can be obtained by applying the present example to the fabrication steps for forming the crystalline silicon film of Example 11 shown in FIGS. 12(A)–12(D) and the crystalline silicon film of Example 3 shown in FIGS. 13(A)–13(D). Specifically, a metal element for promoting crystallization of an amorphous silicon film is selectively introduced into the surface of the amorphous silicon film to grow crystals parallel to the substrate. Then, the silicon film comprising these crystals is irradiated with laser light to further enhance the crystallinity. If this film is then heat-treated, a silicon film having good crystallinity and low defect density can be created.

Example 13

Figure 21:
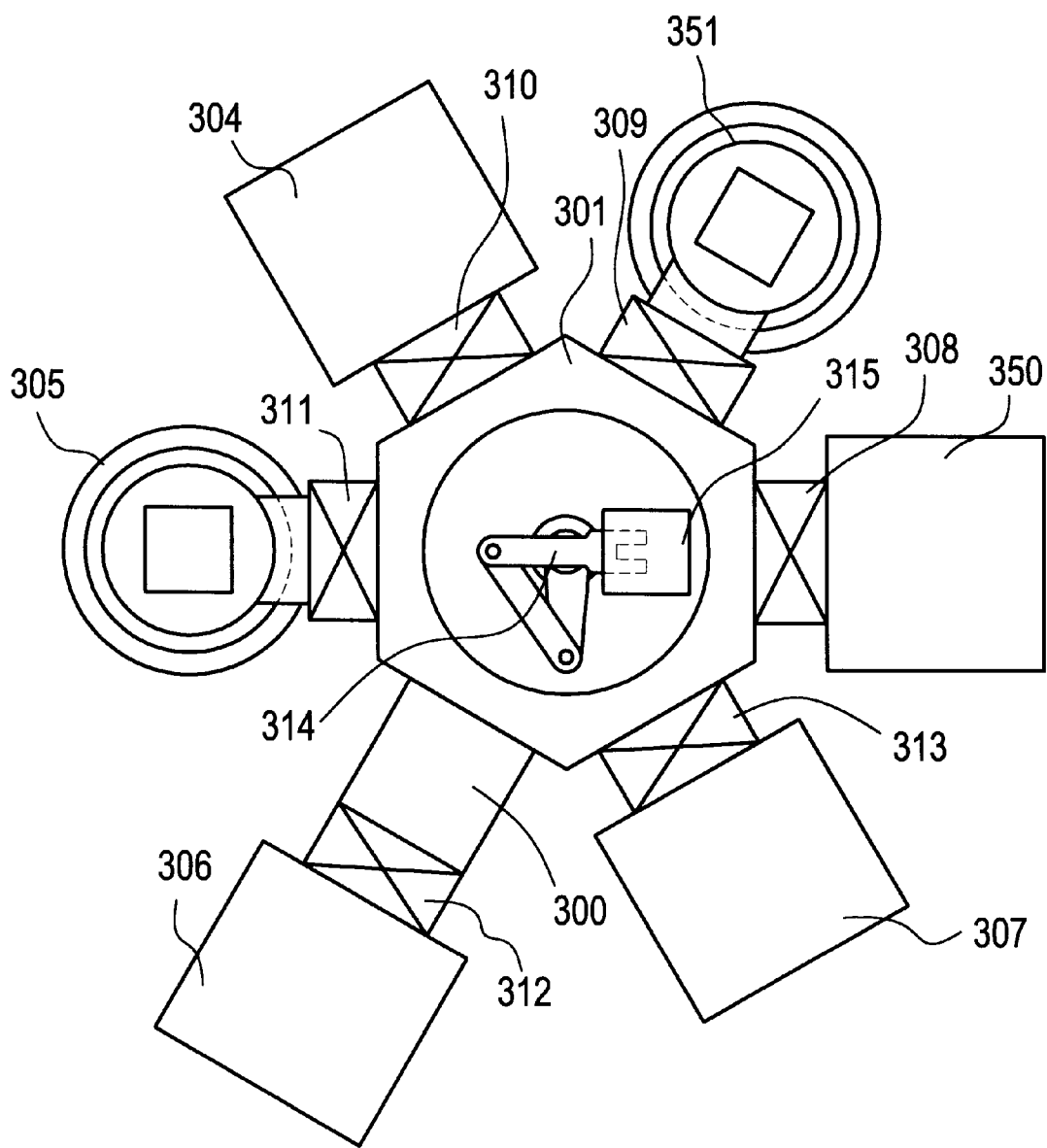
FIG. 21 is a top view of a laser processing system of Example 11 of the invention.
Figure 22:
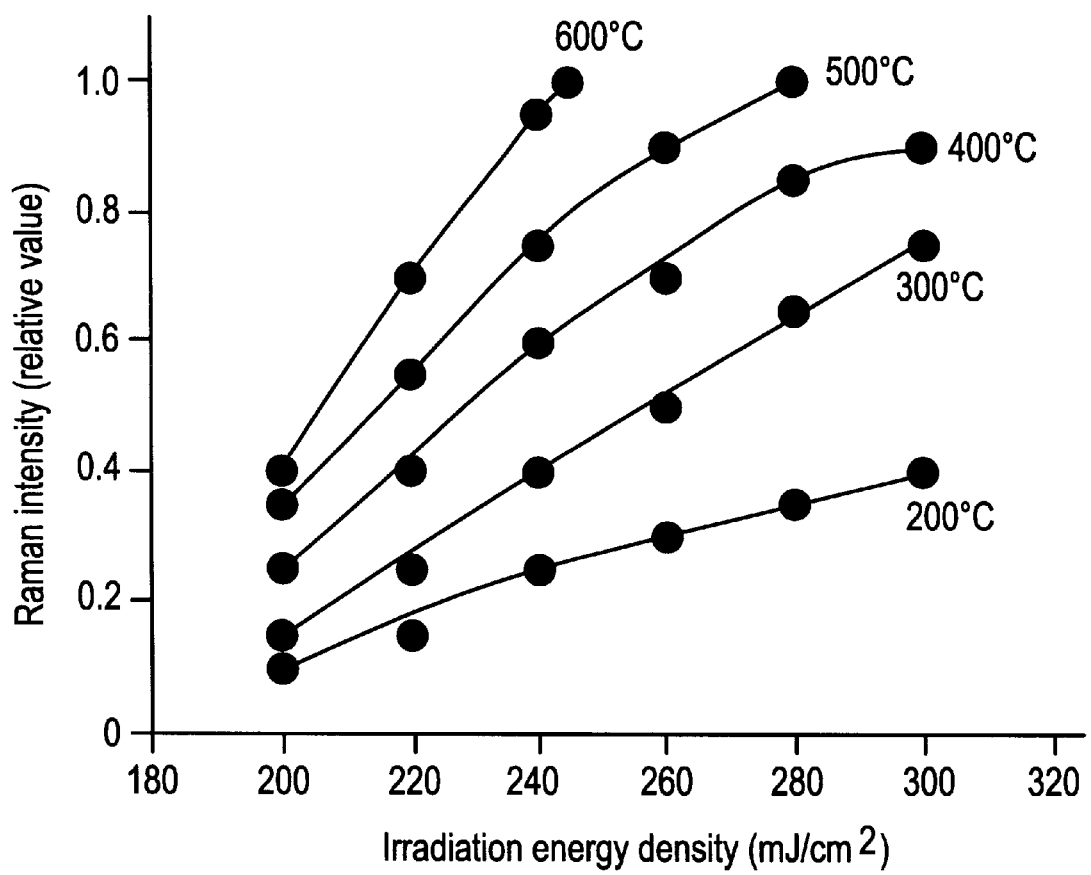
FIG. 22 is a graph indicating the relation (relative values) of the intensities of Raman spectra arising from amorphous silicon films irradiated with laser light to the intensities of the laser light incident on the silicon film.
Figure 23:
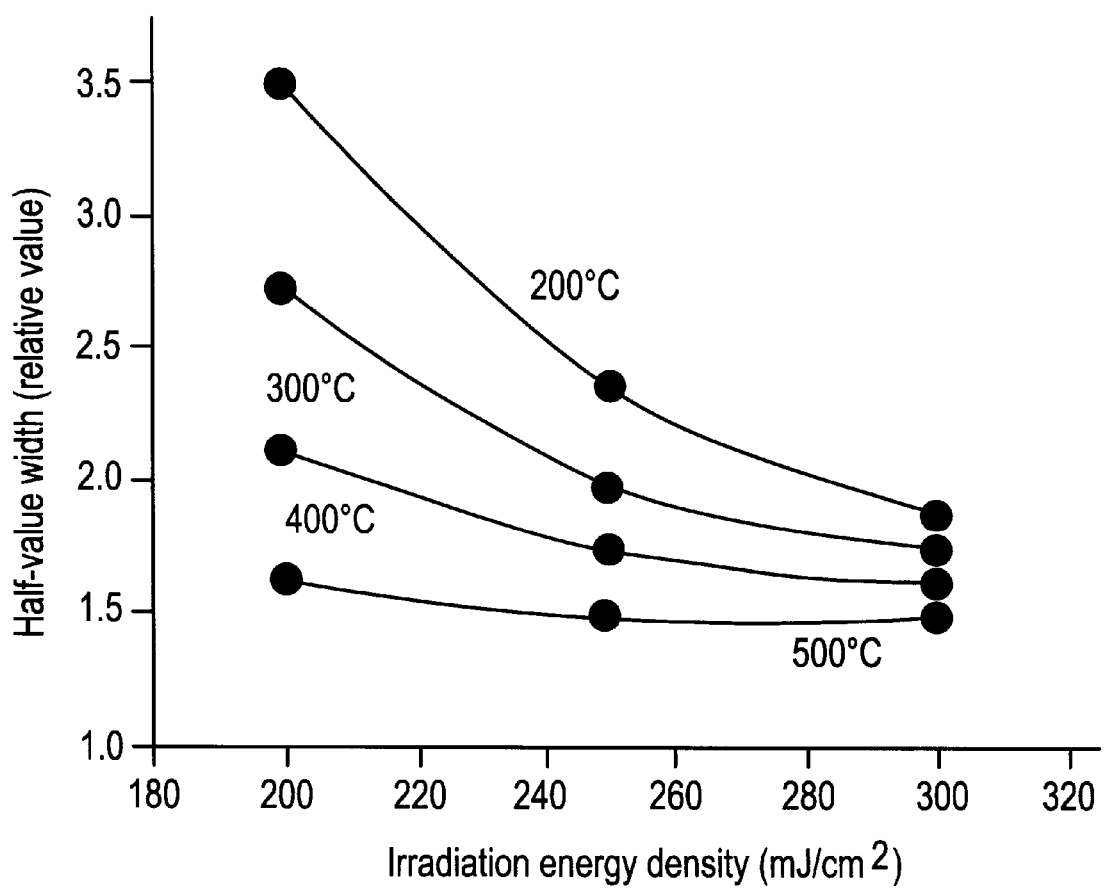
FIG. 23 is a graph indicating the half-value widths (relative values) of the intensities of Raman spectra arising from amorphous silicon films irradiated with laser light to the intensities of the laser light incident on the silicon film.

The present example is a modification of the system shown in FIGS. 18–20. FIG. 21 schematically shows the configuration of the present example. In both FIGS. 18 (illustrating Example 12) and 21, like components are indicated by like reference numerals. In the system shown in FIG. 21, a substrate is first heated in a heating chamber 305. Then, the substrate is irradiated with laser light in a laser processing chamber 304. Thereafter, the substrate is heat-treated in a second heating chamber 351 to reduce the defects in the irradiated silicon film.

After completion of the heating in the heating chamber 351, the substrate is slowly cooled in a slow cooling chamber 350. The speed of the cooling is adjusted by adjusting the amount of nitrogen gas introduced into the slow cooling chamber 350. Subsequently, the substrate is transported into an unloading chamber 307.

The laser irradiation of the present example can be employed for crystallization of an amorphous silicon film, for annealing of a silicon film which was crystallized by heating (corresponding to the cases described in Examples 11 and 3), and for annealing and activation of a silicon film doped with impurity ions.

A crystalline silicon film is crystallized by introduction of a metal element for promoting crystallization and by heat treatment. The crystalline silicon film is annealed by laser irradiation while the sample is heated at a temperature that is within±100° C. of the temperature of the previous heat treatment. In this way, the crystallinity is enhanced further. As a result, a silicon film having good crystallinity can be obtained.

A crystalline silicon film is crystallized by introduction of a metal element for promoting crystallization and by heat treatment. Impurity ions are implanted into the crystalline silicon film. Doped regions can be effectively formed by annealing the substrate by laser irradiation while the sample is heated at a temperature that is within±100° C. of the temperature of the previous heat treatment.

Crystals can be grown in succession by laser irradiation, i.e., by directing laser light having a linear cross section from one side of an amorphous silicon film toward the other side while heating the film at a temperature higher than 450° C. A region which consists of a single crystal or can be regarded as a single crystal can be formed.

Especially, after introducing a metal element for promoting crystallization into an amorphous silicon film, regions of higher crystallinity which can be substantially regarded as a single crystal can be readily formed by performing the abovedescribed laser irradiation. At this time, the metal element can be made to segregate at the points at which the crystal growth ends, by moving the laser beam of the linear cross section during the laser irradiation. As a result, the concentration of the metal element in the crystallized regions can be reduced to a minimum.

In the novel laser processing method, a crystalline silicon film crystallized by heat treatment is heated at a temperature which is within±100° C. of the temperature of the previous heat treatment. Under this condition, the film is annealed by laser irradiation to further enhance the crystallinity. In this way, a silicon film having good crystallinity can be obtained.

Impurity ions are implanted into a silicon film already crystallized by heat treatment. The film is heated at a temperature which is within±100° C. of the temperature of the previous heat treatment. Under this condition, the film is annealed by laser irradiation. In this way, doped regions can be effectively formed.

Furthermore, crystals are grown in succession according to laser irradiation by directing laser light having a linear cross section from one side of an amorphous silicon film toward the other side while heating the film at a temperature higher than 450° C. A region which consists of a single crystal or can be regarded as a single crystal can be formed.

In the novel laser processing method, a metal element for promoting crystallization is introduced into an amorphous silicon film. Under this condition, the above-described laser irradiation is conducted. Thus, regions of higher crystallinity which can be substantially regarded as single crystals can be easily formed. After the laser irradiation, heat treatment is made. Therefore, defects caused by the laser irradiation can be reduced.

During this laser irradiation, the laser light of a linear cross section is swept. In this way, the metal element can be caused to segregate at the points at which crystal growth ends. The concentration of the metal element in the crystallized region can be reduced to a minimum.

What is claimed is:

1. A laser processing method comprising:
    a step of introducing into a semiconductor comprising amorphous silicon a metal element which promotes the crystallization of the amorphous silicon;
    a step of irradiating laser light to the semiconductor; and
    a step of heat annealing the semiconductor at a temperature of 500° C. or higher to reduce defect density,
    a step of heat annealing the semiconductor in an atmosphere comprising hydrogen to terminate internal defects with hydrogen.

2. The method of claim 1 wherein the crystallinity of the silicon film which is crystallized by the heat treating step is promoted by the laser light irradiating step.

3. The method of claim 1 wherein an element or a plurality of elements selected from the group consisting of Fe, Co, Ni, Ru, Rh, Pd, Os, Ir, Pt, Cu, Zn, Ag and Au are used as the metal element.

4. A laser processing method comprising:
    a step of introducing into a semiconductor comprising amorphous silicon a metal element which promotes the crystallization of the amorphous silicon;
    a step of irradiating laser light to the semiconductor; and
    a step of heat annealing the semiconductor at a temperature of 500° C. or higher,
    a step of heat annealing the semiconductor in an atmosphere comprising hydrogen to contain hydrogen in the semiconductor, the concentration of hydrogen in the semiconductor being $10^{20}$cm$^{-3}$ or lower.

5. The method of claim 4 wherein the crystallinity of the silicon film which is crystallized by the heat treating step is promoted by the laser light irradiating step.

6. The method of claim 4 wherein an element or a plurality of elements selected from the group consisting of Fe, Co, Ni, Ru, Rh, Pd, Os, Ir, Pt, Cu, Zn, Ag and Au are used as the metal element.

7. A laser processing method comprising:
    a step of introducing into a semiconductor comprising amorphous silicon a metal element which promotes the crystallization of the amorphous silicon;
    a step of implanting an impurity ion into at least a part of the semiconductor;
    a step of irradiating laser light to the part into which the impurity ion is implanted by the implanting step;
    a step of heat annealing the crystallized semiconductor at a temperature of 500° C. or higher to reduce defect density,
    a step of heat annealing the semiconductor in an atmosphere comprising hydrogen to terminate internal defects with hydrogen.

8. The method of claim 7 wherein the crystallinity of the silicon film which is crystallized by the heat treating step is promoted by the laser light irradiating step.

9. The method of claim 7 wherein an element or a plurality of elements selected from the group consisting of Fe, Co, Ni, Ru, Rh, Pd, Os, Ir, Pt, Cu, Zn, Ag and Au are used as the metal element.

10. A laser processing method comprising:
    introducing into a semiconductor comprising amorphous silicon a metal element which promotes the crystallization of the amorphous silicon;
    moving laser light having a linear beam configuration successively from the side of the semiconductor to another side of the semiconductor, to irradiate the laser light to a surface of the semiconductor,
    heat annealing the semiconductor at a temperature of 500° C. or higher after the laser light irradiation to reduce defect density, and
    a step of heat annealing the semiconductor in an atmosphere comprising hydrogen to terminate internal defects with hydrogen;
    wherein an area of the semiconductor irradiated with the laser light is successively crystallized.

11. The method of claim 10 wherein an element or a plurality of elements selected from the group consisting of Fe, Co, Ni, Ru, Rh, Pd, Os, Ir, Pt, Cu, Zn, Ag and Au are used as the metal element.

12. The method of claim 10 wherein the metal element is selectively introduced into a predetermined area of the amorphous silicon film.

13. A laser processing method comprising the steps of:

producing laser light of a linear cross section; and directing said laser light to a surface of a semiconductor comprising amorphous silicon while moving said laser light from one side of said semiconductor to an opposite side of said semiconductor in succession; and heat annealing the semiconductor at a temperature of 500° C. or higher to reduce defect density, heat annealing the semiconductor in an atmosphere comprising hydrogen to terminate internal defects with hydrogen.

14. A laser processing method comprising:

a step of introducing into a semiconductor comprising amorphous silicon a metal element which promotes the crystallization of the amorphous silicon;

a step of implanting an impurity ion into at least a part of the semiconductor;

a step of irradiating laser light to the part into which the impurity ion is implanted by the implanting step;

a step of heat annealing the crystallized semiconductor at a temperature of 500° C. or higher to reduce defect density, a step of heat annealing the semiconductor in an atmosphere comprising hydrogen to contain hydrogen in the semiconductor, the concentration of hydrogen in the semiconductor being $10^{20} cm^{-3}$ or lower.

15. A laser processing method comprising:

introducing into a semiconductor comprising amorphous silicon a metal element which promotes the crystallization of the amorphous silicon;

moving laser light having a linear beam configuration successively from the side of the semiconductor to another side of the semiconductor, to irradiate the laser light to a surface of the amorphous silicon film semiconductor, heat annealing the semiconductor at a temperature of 500° C. or higher after the laser light irradiation to reduce defect density, and a step of heat annealing the semiconductor in an atmosphere comprising hydrogen to contain hydrogen in the semiconductor, the concentration of hydrogen in the semiconductor being $10^{20} cm^{-3}$ or lower, wherein an area of the semiconductor irradiated with the laser light is successively crystallized.

16. A laser processing method comprising the steps of:

producing laser light of a linear cross section; and directing said laser light to a surface of a semiconductor comprising amorphous silicon while moving said laser light from one side of said semiconductor to an opposite side of said semiconductor in succession; and heating annealing the semiconductor at a temperature of 500° C. or higher to reduce defect density, and heat annealing the semiconductor in an atmosphere comprising hydrogen to contain hydrogen in the semiconductor, the concentration of hydrogen in the semiconductor being $10^{20} cm^{-3}$ or lower.

17. A laser processing method comprising:

a step of irradiating laser light to a semiconductor comprising silicon and containing a metal element which promotes the crystallization of the amorphous silicon;

a step of heat annealing the semiconductor at a temperature of 500° C. or higher to reduce defect density, and a step of heat annealing the semiconductor in an atmosphere comprising hydrogen to contain hydrogen in the semiconductor, the concentration of hydrogen in the semiconductor being $10^{20} cm^{-3}$ or lower.

18. A laser processing method comprising:

a step of irradiating laser light to a semiconductor comprising silicon and containing a metal element which promotes the crystallization of the amorphous silicon;

a step of heat annealing the semiconductor at a temperature of 500° C. or higher to reduce defect density, and heat annealing the semiconductor in an atmosphere comprising hydrogen to terminate internal defect with hydrogen.

* * * * *